US011573552B2

United States Patent
Iwamura

(10) Patent No.: US 11,573,552 B2
(45) Date of Patent: Feb. 7, 2023

(54) MICROSTRUCTURE CALCULATING APPARATUS

(71) Applicant: UACJ Corporation, Tokyo (JP)

(72) Inventor: Shingo Iwamura, Tokyo (JP)

(73) Assignee: UACJ CORPORATION, Tokyo (JP)

( * ) Notice: Subject to any disclaimer, the term of this patent is extended or adjusted under 35 U.S.C. 154(b) by 609 days.

(21) Appl. No.: 16/617,791

(22) PCT Filed: May 23, 2018

(86) PCT No.: PCT/JP2018/019847
§ 371 (c)(1),
(2) Date: Nov. 27, 2019

(87) PCT Pub. No.: WO2018/221353
PCT Pub. Date: Dec. 6, 2018

(65) Prior Publication Data
US 2020/0114406 A1    Apr. 16, 2020

(30) Foreign Application Priority Data

May 30, 2017 (JP) .............................. JP2017-106892

(51) Int. Cl.
*C22F 1/04* (2006.01)
*G06F 17/10* (2006.01)
(Continued)

(52) U.S. Cl.
CPC ................ *G05B 19/18* (2013.01); *C22F 1/04* (2013.01); *G06F 17/10* (2013.01); *G06F 30/20* (2020.01); *B21B 2003/001* (2013.01)

(58) Field of Classification Search
CPC ......... G05B 19/18; G06F 17/10; G06F 30/20; C22F 1/04; C22F 1/00; B21C 51/00; B21B 2201/06; B21B 2003/001
See application file for complete search history.

(56) References Cited

U.S. PATENT DOCUMENTS

| 2009/0083206 A1* | 3/2009 | Shigemori ............. G06Q 50/04 706/46 |
| 2010/0235110 A1* | 9/2010 | Wang ...................... G06F 30/20 702/43 |

(Continued)

FOREIGN PATENT DOCUMENTS

| CN | 104809263 A   * | 7/2015 | ......... G06F 17/5018 |
| DE | 102010019733 A1 * | 1/2011 | ......... G06F 17/5018 |

(Continued)

OTHER PUBLICATIONS

Azuma, Masafumi, Manabu Takahashi, and Nobuhiro Fujita. "Model for the Prediction of Microstructures and Mechanical Properties of Cold-rolled High Strength Steels." Nippon Steel Technical Report 102 (2013): 44-50. (Year: 2013).*
Nes et al., "Modelling the evolution in microstructure and properties during processing of aluminium alloys," Journal of Materials Processing Technology 117 (2001) 333-340.
Robson et al., "Extension of the N-model to predict competing homogeneous and heterogeneous precipitation in Al-Sc alloys", Acta Materialia 51 (2003) 1453-1468.

(Continued)

*Primary Examiner* — Eunhee Kim
(74) *Attorney, Agent, or Firm* — McCarter & English, LLP

(57) ABSTRACT

An object is to predict a microstructure of Al in an industrial process more accurately than conventional techniques. In an information processor (1), an inter-step information integration section supplies a PC(i) and an MS(i, 0) to each i-th step calculating section included in a step calculating section. Each i-th step calculating section supplies an MS(i, t) and a TMP(i, t) to a microstructure calculating section and thereby causes the microstructure calculating section to find an MS(i, tfi), and supplies the MS(i, tfi) to the inter-step information integration section (11). The inter-step informa- (Continued)

tion integration section (11) sets, as an MS(i+1, 0), the MS(i, tfi) received from the i-th step calculating section.

8 Claims, 18 Drawing Sheets

(51) Int. Cl.
*G06F 30/20* (2020.01)
*B21B 3/00* (2006.01)
*G05B 19/18* (2006.01)

(56) References Cited

U.S. PATENT DOCUMENTS

| | | | | |
|---|---|---|---|---|
| 2010/0292966 A1* | 11/2010 | Wang | ...................... | G06F 30/23 |
| | | | | 703/2 |
| 2011/0144788 A1* | 6/2011 | Wang | ...................... | G06F 30/23 |
| | | | | 703/2 |
| 2015/0023387 A1* | 1/2015 | Narihara | ............... | B21B 38/006 |
| | | | | 374/45 |
| 2017/0297072 A1* | 10/2017 | Kuyama | .................. | G01N 3/08 |

FOREIGN PATENT DOCUMENTS

| | | |
|---|---|---|
| JP | 34-002957 | 1/1992 |
| JP | 2002-022471 A | 1/2002 |
| JP | 2002-224721 A | 8/2002 |
| JP | 2017-20098 A | 1/2017 |

OTHER PUBLICATIONS

Humphreys, "A Unified Theory of Recovery, Recrystallization and Grain Growth, Based on the Stability and Growth of Cellular Microstructures-I. The Basic Model," Acta mater. vol. 45, No. 10, pp. 4231-4240, 1997.
International Search Report dated Jul. 24, 2018 in corresponding PCT Application No. PCT/JP2018/019847.
International Preliminary Report on Patentability dated Dec. 3, 2019 in corresponding PCT Application No. PCT/JP2018/019847.

* cited by examiner

FIG. 6

| STEP | ITEM |
|---|---|
| HOMOGENIZATION TREATMENT STEP (FIRST STEP) | STARTING TEMPERATURE |
| | RATE OF TEMPERATURE INCREASE |
| | HOLDING TEMPERATURE |
| | HOLDING TIME |
| | COOLING RATE |
| | END TEMPERATURE |
| | END HOLDING TIME |
| HOT ROUGH ROLLING STEP (SECOND STEP) | PLATE THICKNESS AT ENTRANCE SIDE FOR EACH PASS |
| | ROLLING REDUCTION FOR EACH PASS |
| | ROLLING SPEED FOR EACH PASS |
| | TEMPERATURE FOR EACH PASS |
| | HOLDING TIME BETWEEN SUCCESSIVE PASSES |
| | ROLL DIAMETER FOR EACH PASS |
| HOT FINISHING ROLLING STEP (THIRD STEP) | PLATE THICKNESS AT ENTRANCE SIDE FOR EACH PASS |
| | ROLLING REDUCTION FOR EACH PASS |
| | ROLLING SPEED FOR EACH PASS |
| | TEMPERATURE FOR EACH PASS |
| | HOLDING TIME BETWEEN SUCCESSIVE PASSES |
| | ROLL DIAMETER FOR EACH PASS |
| | RATE OF COOLING AFTER WINDING |
| | TEMPERATURE AT END OF COOLING |

FIG. 7

| ITEM | HOMOGENIZATION TREATMENT | HOT ROUGH ROLLING | HOT FINISHING ROLLING |
|---|---|---|---|
| RECRYSTALLIZATION RATIO | USED IN CALCULATION | USED IN CALCULATION | USED IN CALCULATION |
| GRAIN DIAMETER | USED IN CALCULATION | USED IN CALCULATION | USED IN CALCULATION |
| STRAIN ENERGY | USED IN CALCULATION | USED IN CALCULATION | USED IN CALCULATION |
| AMOUNT OF ALLOYING ELEMENT | USED IN CALCULATION | USED IN CALCULATION | USED IN CALCULATION |
| AMOUNT OF SOLUTE ELEMENT OF ALLOYING ELEMENT | USED IN CALCULATION | USED IN CALCULATION | USED IN CALCULATION |
| AMOUNT OF PRECIPITATED ALLOYING ELEMENT | USED IN CALCULATION | USED IN CALCULATION | USED IN CALCULATION |
| NUMBER DENSITY OF PRECIPITATE | USED IN CALCULATION | USED IN CALCULATION | USED IN CALCULATION |
| VOLUME FRACTION OF PRECIPITATE | USED IN CALCULATION | USED IN CALCULATION | USED IN CALCULATION |
| AVERAGE RADIUS OF PRECIPITATE | USED IN CALCULATION | USED IN CALCULATION | USED IN CALCULATION |
| NUMBER DENSITY OF CONSTITUTION PARTICLES | USED IN CALCULATION | USED IN CALCULATION | USED IN CALCULATION |
| VOLUME RATIO OF CONSTITUTION PARTICLES | USED IN CALCULATION | USED IN CALCULATION | USED IN CALCULATION |
| AVERAGE RADIUS OF CONSTITUTION PARTICLES | USED IN CALCULATION | USED IN CALCULATION | USED IN CALCULATION |

FIG. 9

| LOT NO. | MEASURED VALUE | | | CALCULATED VALUE | | | ERROR EVALUATION VALUE | | | |
|---|---|---|---|---|---|---|---|---|---|---|
| | AFTER HOMOGENIZATION TREATMENT | AFTER HOT FINISHING ROLLING | | AFTER HOMOGENIZATION TREATMENT | AFTER HOT FINISHING ROLLING | | AFTER HOMOGENIZATION TREATMENT | AFTER HOT FINISHING ROLLING | | |
| | AVERAGE PARTICLE RADIUS Rpexp | GRAIN DIAMETER OF RECRYSTALLIZED PORTION Dexp | RECRYSTALLIZATION RATIO Yexp | AVERAGE PARTICLE RADIUS Rpcal | GRAIN DIAMETER OF RECRYSTALLIZED PORTION Dcal | RECRYSTALLIZATION RATIO Ycal | ERp | ED | EY | Em |
| | [nm] | [μm] | [-] | [nm] | [μm] | [-] | [-] | [-] | [-] | [-] |
| 1 | 121 | 38 | 100 | 102 | 47 | 99 | 0.17 | 0.21 | 0.01 | 0.13 |
| 2 | 82 | 44 | 100 | 91 | 48 | 99 | 0.10 | 0.09 | 0.01 | 0.07 |
| 3 | 43 | 104 | 85 | 46 | 110 | 86 | 0.07 | 0.06 | 0.01 | 0.05 |
| 4 | 51 | 54 | 95 | 55 | 60 | 95 | 0.08 | 0.11 | 0.00 | 0.06 |
| 5 | 58 | 67 | 95 | 63 | 71 | 96 | 0.08 | 0.06 | 0.01 | 0.05 |
| 6 | 38 | 35 | 100 | 43 | 46 | 100 | 0.12 | 0.27 | 0.00 | 0.13 |
| 7 | 126 | 50 | 100 | 116 | 56 | 100 | 0.08 | 0.11 | 0.00 | 0.07 |
| 8 | 84 | 43 | 100 | 110 | 40 | 99 | 0.27 | 0.07 | 0.01 | 0.12 |
| 9 | 121 | 51 | 100 | 136 | 48 | 100 | 0.12 | 0.06 | 0.00 | 0.06 |
| 10 | 97 | 64 | 90 | 122 | 66 | 96 | 0.23 | 0.03 | 0.06 | 0.11 |
| MEAN | 82 | 55 | 97 | 88 | 59 | 97 | 0.13 | 0.11 | 0.01 | 0.08 |

FIG. 10

| | INFORMATION SHARING BETWEEN STEPS | TMP CALCULATION FOR EACH STEP | MS CALCULATION FOR EACH STEP | PC | TMP | MS |
|---|---|---|---|---|---|---|
| EXAMPLE | INTER-STEP INFORMATION INTEGRATION SECTION | STEP CALCULATING SECTION | MICROSTRUCTURE CALCULATING SECTION | SEE FIG. 6 | TEMPERATURE AMOUNT OF STRAIN RATE OF STRAIN | SEE FIG. 7 |
| COMPARATIVE EXAMPLE | MANUAL OPERATION | MICROSTRUCTURE CALCULATION ON PER-STEP BASIS | | | | SEE FIG. 12 |
| REFERENCE EXAMPLE 1 | INTER-STEP INFORMATION INTEGRATION SECTION | MICROSTRUCTURE CALCULATION ON PER-STEP BASIS | | | | SEE FIG. 7 |
| REFERENCE EXAMPLE 2 | MANUAL OPERATION | STEP CALCULATING SECTION | MICROSTRUCTURE CALCULATING SECTION | | | SEE FIG. 12 |

FIG. 11

| | EASINESS OF CALCULATION | | ACCURACY OF CALCULATION | EASINESS OF DEVELOPMENT | |
|---|---|---|---|---|---|
| | CALCULATIONS FOR ALL STEPS | INFORMATION TRANSFER BETWEEN STEPS | TARGET OF MODEL ADJUSTMENT | MICROSTRUCTURE CALCULATION | APPLICATION TO OTHER STEPS |
| EXAMPLE | GOOD<br>CALCULATIONS ARE CARRIED OUT AS A WHOLE | GOOD<br>AUTOMATIC | GOOD<br>ADJUSTMENT INFLUENCES ALL STEPS | GOOD<br>IT IS ONLY NECESSARY TO DESIGN MICROSTRUCTURE CALCULATION MODULE COMMON TO ALL STEPS | GOOD<br>IT IS ONLY NECESSARY TO ADDITIONALLY DESIGN STEP CALCULATING MODULE |
| COMPARATIVE EXAMPLE | POOR<br>EACH CALCULATION IS CARRIED OUT SEPARATELY | POOR<br>MANUAL | FAIR<br>ADJUSTMENT IS ON PER-STEP BASIS | POOR<br>IT IS NECESSARY TO DESIGN DIFFERENT MICROSTRUCTURE CALCULATION MODULES FOR RESPECTIVE STEPS | POOR<br>IT IS NECESSARY TO ADDITIONALLY DESIGN STEP CALCULATING MODULE AND MICROSTRUCTURE CALCULATING MODULE |
| REFERENCE EXAMPLE 1 | GOOD<br>CALCULATIONS ARE CARRIED OUT AS A WHOLE | GOOD<br>AUTOMATIC | FAIR<br>ADJUSTMENT IS ON PER-STEP BASIS | POOR<br>IT IS NECESSARY TO DESIGN DIFFERENT MICROSTRUCTURE CALCULATION MODULES FOR RESPECTIVE STEPS | POOR<br>IT IS NECESSARY TO ADDITIONALLY DESIGN STEP CALCULATING MODULE AND MICROSTRUCTURE CALCULATING MODULE |
| REFERENCE EXAMPLE 2 | POOR<br>EACH CALCULATION IS CARRIED OUT SEPARATELY | POOR<br>MANUAL | FAIR<br>ADJUSTMENT IS ON PER-STEP BASIS | GOOD<br>IT IS ONLY NECESSARY TO DESIGN MICROSTRUCTURE CALCULATION MODULE COMMON TO ALL STEPS | GOOD<br>IT IS ONLY NECESSARY TO ADDITIONALLY DESIGN STEP CALCULATING MODULE |

FIG. 12

| ITEM | HOMOGENIZATION TREATMENT | HOT ROUGH ROLLING | HOT FINISHING ROLLING |
|---|---|---|---|
| RECRYSTALLIZATION RATIO | NOT USED IN CALCULATION | USED IN CALCULATION | USED IN CALCULATION |
| GRAIN DIAMETER | NOT USED IN CALCULATION | USED IN CALCULATION | USED IN CALCULATION |
| STRAIN ENERGY | NOT USED IN CALCULATION | USED IN CALCULATION | USED IN CALCULATION |
| AMOUNT OF ALLOYING ELEMENT | USED IN CALCULATION | USED IN CALCULATION | USED IN CALCULATION |
| AMOUNT OF SOLUTE ELEMENT OF ALLOYING ELEMENT | USED IN CALCULATION | USED IN CALCULATION | USED IN CALCULATION |
| AMOUNT OF PRECIPITATED ALLOYING ELEMENT | USED IN CALCULATION | USED IN CALCULATION | USED IN CALCULATION |
| NUMBER DENSITY OF PRECIPITATE | USED IN CALCULATION | USED IN CALCULATION | USED IN CALCULATION |
| VOLUME FRACTION OF PRECIPITATE | USED IN CALCULATION | USED IN CALCULATION | USED IN CALCULATION |
| AVERAGE RADIUS OF PRECIPITATE | USED IN CALCULATION | USED IN CALCULATION | USED IN CALCULATION |
| NUMBER DENSITY OF CONSTITUTION PARTICLES | USED IN CALCULATION | USED IN CALCULATION | USED IN CALCULATION |
| VOLUME RATIO OF CONSTITUTION PARTICLES | USED IN CALCULATION | USED IN CALCULATION | USED IN CALCULATION |
| AVERAGE RADIUS OF CONSTITUTION PARTICLES | USED IN CALCULATION | USED IN CALCULATION | USED IN CALCULATION |

FIG. 14

| LOT NO. | MEASURED VALUE | | | | CALCULATED VALUE | | | ERROR EVALUATION VALUE | | | |
|---|---|---|---|---|---|---|---|---|---|---|---|
| | AFTER HOMOGENIZATION TREATMENT | AFTER HOT FINISHING ROLLING | | | AFTER HOMOGENIZATION TREATMENT | AFTER HOT FINISHING ROLLING | | AFTER HOMOGENIZATION TREATMENT | AFTER HOT FINISHING ROLLING | | |
| | AVERAGE PARTICLE RADIUS Rpexp | GRAIN DIAMETER OF RECRYSTALLIZED PORTION Dexp | RECRYSTALLIZATION RATIO Yexp | | AVERAGE PARTICLE RADIUS Rpcal | GRAIN DIAMETER OF RECRYSTALLIZED PORTION Dcal | RECRYSTALLIZATION RATIO Ycal | ERp | ED | EY | Em |
| | [nm] | [μm] | [-] | | [nm] | [μm] | [-] | [-] | [-] | [-] | [-] |
| 1 | 121 | 38 | 100 | | 144 | 43 | 98 | 0.17 | 0.12 | 0.02 | 0.10 |
| 2 | 82 | 44 | 100 | | 94 | 66 | 96 | 0.14 | 0.40 | 0.04 | 0.19 |
| 3 | 43 | 104 | 85 | | 89 | 178 | 42 | 0.70 | 0.53 | 0.68 | 0.63 |
| 4 | 51 | 54 | 95 | | 25 | 94 | 84 | 0.69 | 0.54 | 0.12 | 0.45 |
| 5 | 58 | 67 | 95 | | 172 | 162 | 67 | 0.99 | 0.83 | 0.35 | 0.72 |
| 6 | 38 | 35 | 100 | | 21 | 43 | 86 | 0.56 | 0.20 | 0.15 | 0.30 |
| 7 | 126 | 50 | 100 | | 345 | 48 | 90 | 0.93 | 0.04 | 0.11 | 0.36 |
| 8 | 84 | 43 | 100 | | 66 | 34 | 88 | 0.24 | 0.22 | 0.13 | 0.20 |
| 9 | 121 | 51 | 100 | | 126 | 38 | 97 | 0.04 | 0.29 | 0.03 | 0.12 |
| 10 | 97 | 64 | 90 | | 202 | 73 | 50 | 0.70 | 0.13 | 0.57 | 0.47 |
| MEAN | 82 | 55 | 97 | | 128 | 78 | 80 | 0.52 | 0.33 | 0.22 | 0.35 |

FIG. 16

| LOT NO. | MEASURED VALUE | | | CALCULATED VALUE | | | ERROR EVALUATION VALUE | | | |
|---|---|---|---|---|---|---|---|---|---|---|
| | AFTER HOMOGENIZATION TREATMENT | AFTER HOT FINISHING ROLLING | | AFTER HOMOGENIZATION TREATMENT | AFTER HOT FINISHING ROLLING | | AFTER HOMOGENIZATION TREATMENT | AFTER HOT FINISHING ROLLING | | Em |
| | AVERAGE PARTICLE RADIUS Rpexp | GRAIN DIAMETER OF RECRYSTALLIZED PORTION Dexp | RECRYSTALLIZATION RATIO Yexp | AVERAGE PARTICLE RADIUS Rpcal | GRAIN DIAMETER OF RECRYSTALLIZED PORTION Dcal | RECRYSTALLIZATION RATIO Ycal | ERp | ED | EY | |
| | [nm] | [μm] | [-] | [nm] | [μm] | [-] | [-] | [-] | [-] | [-] |
| 1 | 121 | 38 | 100 | 130 | 102 | 99 | 0.07 | 0.91 | 0.01 | 0.33 |
| 2 | 82 | 44 | 100 | 86 | 49 | 99 | 0.05 | 0.11 | 0.01 | 0.06 |
| 3 | 43 | 104 | 85 | 50 | 291 | 46 | 0.15 | 0.95 | 0.60 | 0.56 |
| 4 | 51 | 54 | 95 | 58 | 161 | 62 | 0.13 | 1.00 | 0.42 | 0.51 |
| 5 | 58 | 67 | 95 | 54 | 113 | 68 | 0.07 | 0.51 | 0.33 | 0.30 |
| 6 | 38 | 35 | 100 | 48 | 60 | 100 | 0.23 | 0.53 | 0.00 | 0.25 |
| 7 | 126 | 50 | 100 | 140 | 106 | 100 | 0.11 | 0.72 | 0.00 | 0.27 |
| 8 | 84 | 43 | 100 | 99 | 83 | 95 | 0.16 | 0.63 | 0.05 | 0.28 |
| 9 | 121 | 51 | 100 | 122 | 82 | 98 | 0.01 | 0.47 | 0.02 | 0.16 |
| 10 | 97 | 64 | 90 | 113 | 70 | 70 | 0.15 | 0.09 | 0.25 | 0.16 |
| MEAN | 82 | 55 | 97 | 90 | 112 | 84 | 0.11 | 0.59 | 0.17 | 0.29 |

FIG. 18

| LOT NO. | MEASURED VALUE | | | CALCULATED VALUE | | | ERROR EVALUATION VALUE | | | |
|---|---|---|---|---|---|---|---|---|---|---|
| | AFTER HOMOGENIZATION TREATMENT | AFTER HOT FINISHING ROLLING | | AFTER HOMOGENIZATION TREATMENT | AFTER HOT FINISHING ROLLING | | AFTER HOMOGENIZATION TREATMENT | AFTER HOT FINISHING ROLLING | | |
| | AVERAGE PARTICLE RADIUS Rpexp | GRAIN DIAMETER OF RECRYSTALLIZED PORTION Dexp | RECRYSTALLIZATION RATIO Yexp | AVERAGE PARTICLE RADIUS Rpcal | GRAIN DIAMETER OF RECRYSTALLIZED PORTION Dcal | RECRYSTALLIZATION RATIO Ycal | ERp | ED | EY | Em |
| | [nm] | [μm] | [-] | [nm] | [μm] | [-] | [-] | [-] | [-] | [-] |
| 1 | 121 | 38 | 100 | 211 | 57 | 88 | 0.54 | 0.40 | 0.13 | 0.36 |
| 2 | 82 | 44 | 100 | 66 | 76 | 80 | 0.21 | 0.54 | 0.22 | 0.32 |
| 3 | 43 | 104 | 85 | 66 | 305 | 25 | 0.42 | 0.98 | 1.09 | 0.83 |
| 4 | 51 | 54 | 95 | 85 | 156 | 70 | 0.50 | 0.97 | 0.30 | 0.59 |
| 5 | 58 | 67 | 95 | 79 | 190 | 73 | 0.30 | 0.96 | 0.26 | 0.51 |
| 6 | 38 | 35 | 100 | 65 | 26 | 86 | 0.53 | 0.30 | 0.15 | 0.32 |
| 7 | 126 | 50 | 100 | 107 | 123 | 83 | 0.16 | 0.84 | 0.19 | 0.40 |
| 8 | 84 | 43 | 100 | 126 | 54 | 84 | 0.40 | 0.23 | 0.17 | 0.27 |
| 9 | 121 | 51 | 100 | 109 | 52 | 90 | 0.11 | 0.01 | 0.11 | 0.07 |
| 10 | 97 | 64 | 90 | 107 | 93 | 55 | 0.10 | 0.37 | 0.48 | 0.32 |
| MEAN | 82 | 55 | 97 | 102 | 113 | 73 | 0.33 | 0.56 | 0.31 | 0.40 |

MICROSTRUCTURE CALCULATING APPARATUS

TECHNICAL FIELD

The present invention relates to a microstructure calculating apparatus configured to calculate a microstructure of aluminum (Al) manufactured by an industrial process.

BACKGROUND ART

In recent years, there has been proposed a technique to, in order to decide the processing conditions in which a metallic material is manufactured by an industrial process, predict a change in properties of the metallic material that would occur in each process step. For example, Patent Literature 1 discloses a method of predicting material properties of an Al alloy sheet in a process of manufacture of the Al alloy sheet.

CITATION LIST

Patent Literature

Patent Literature 1

Japanese Patent Application Publication Tokukai No. 2002-22471 (Publication date: Aug. 13, 2002)

SUMMARY OF INVENTION

Technical Problem

Note, however, that a method of predicting (calculating) a microstructure of Al in an industrial process still has room for improvement, as will be described later. An object of an aspect of the present invention is to predict a microstructure of Al in an industrial process more accurately than conventional techniques.

Solution to Problem

In order to attain the above object, a microstructure calculating apparatus in accordance with an aspect of the present invention is a microstructure calculating apparatus, wherein, with regard to an industrial process for manufacturing aluminum, the industrial process including first to N-th steps, i is a natural number satisfying $1 \leq i \leq N$, t represents a time in an i-th step, $t=0$ represents a time at which the i-th step starts, and $t=tfi$ represents a time at which the i-th step ends, PC(i) represents a piece of information indicative of a processing condition for the aluminum in an i-th step, TMP(i, t) represents a piece of information indicative of a thermo-mechanical processing condition for the aluminum at a time t in an i-th step, and MS(i, t) represents a piece of information indicative of a microstructure of the aluminum at a time t in an i-th step, the microstructure calculating apparatus including: an inter-step information integration section configured to acquire PC(1) to PC(N) and MS(1, 0) as pieces of preset information; a step calculating section including first to N-th step calculating sections; and a microstructure calculating section configured to find a change over time in MS(i, t) based on an MS(i, t) and a TMP(i, t), the microstructure calculating section including a plurality of calculation modules configured to find changes over time in a respective plurality of metallurgical phenomena, an i-th step calculating section of the step calculating section being configured to find a TMP(i, t) based on a PC(i), the plurality of calculation modules being configured to receive respective MSs(i, t) having a common data structure, wherein, in the order of from i=1 to i=N, the inter-step information integration section supplies a PC(i) and an MS(i, 0) to each i-th step calculating section, and in each i-th step, in the order of from t=0 to t=tfi, the i-th step calculating section (i) supplies an MS(i, t) and a TMP(i, t) to the microstructure calculating section and thereby causes the microstructure calculating section to find an MS(i, tfi) and (ii) supplies the MS(i, tfi) to the inter-step information integration section, and the inter-step information integration section sets, as an MS(i+1, 0), the MS(i, tfi) received from the i-th step calculating section.

Advantageous Effects of Invention

According to a microstructure calculating apparatus in accordance with an aspect of the present invention, it is possible to predict a microstructure of Al in an industrial process more accurately than conventional techniques.

BRIEF DESCRIPTION OF DRAWINGS

FIG. 6 shows items of PCs in an Example.

FIG. 7 shows items of MSs in the Example.

FIG. 9 shows calculation results obtained in the Example.

FIG. 10 shows differences in calculation process between the Example, a Comparative Example, and Reference Examples.

FIG. 11 shows comparisons between the Example, Comparative Example, and Reference Examples.

FIG. 12 is a table showing items of MSs in the Comparative Example.

FIG. 14 shows calculation results obtained in the Comparative Example.

FIG. 16 shows calculation results obtained in Reference Example 1.

FIG. 18 shows calculation results obtained in Reference Example 2.

DESCRIPTION OF EMBODIMENTS

Embodiment 1

Figure 1:
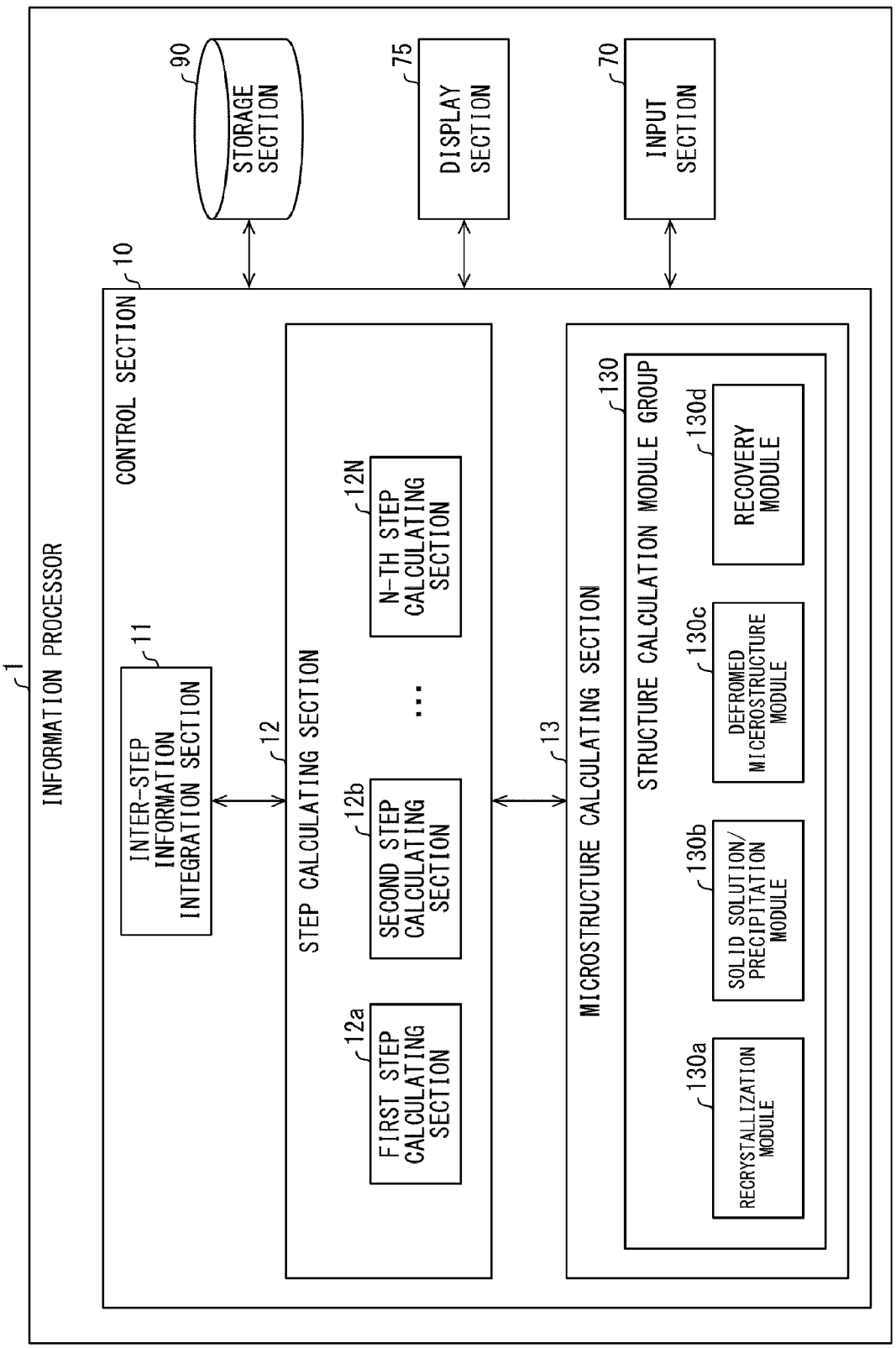
FIG. 1 is a functional block diagram illustrating a configuration of main parts of an information processor in accordance with Embodiment 1.

The following description will discuss Embodiment 1 of the present invention in detail with reference to FIGS. 1 to 18. An information processor 1 (microstructure calculating apparatus) in accordance with Embodiment 1 calculates (predicts) a change over time (temporal change) in a microstructure of Al, on the basis of (i) a piece of information indicative of the earliest microstructure of Al (such information is MS(1, 0), which will be described later) and (ii) pieces of information indicative of processing conditions for respective steps of an Al manufacturing process (such pieces of information are PC(1) to PC(N), which will be described later).

Definitions of Terms

First of all, terms used in this specification are defined prior to describing a specific configuration of the information processor 1.

A "process step" may be any step which is a part of an Al (Al product) manufacturing process. Examples of the process step include steps related to processing and/or heat treatment of expanded Al (such as homogenization treatment, hot rolling, cold rolling, hot extrusion, drawing, hot forging, cold forging, solution heat treatment, aging treatment, and annealing).

A "processing condition" (hereinafter may be referred to as "PC") may be any condition related to quality (properties) of Al for a process step. A PC includes values set on equipment in a process step. For example, in a case of cold rolling, the PC includes a set value of initial plate thickness, a set value of final sheet thickness, a set rolling reduction, a set value of rolling speed, a set value of rolling work roll diameter, and/or the like. The PC will be described later in more detail.

The term "thermo-mechanical processing condition" (hereinafter may be referred to as "TMP") means a temperature applied to Al at a certain time under a certain PC, the amount of strain applied to Al at the certain time under the certain PC, the rate of strain applied to Al at the certain time under the certain PC, and/or the like. According to a microstructure calculating apparatus in accordance with an aspect of the present invention, a PC data set (PC(i), which will be described later) needs to be set so that a TMP can be found. The TMP will be described later in more detail.

A TMP can be calculated using a known simulation technique such as a finite element method (FEM). For example, in a case of hot extrusion, a TMP can be calculated by an FEM with use of set values of, for example, constituents of an Al alloy, temperature of a container, billet temperature, shape of extrusion, extruder speed, and/or the like.

The term "microstructure" (hereinafter may be referred to as "MS") refers to a microscopic microstructure (metallic microstructure). Examples of MS include solute elements, precipitates, constitution particles, dislocations, subgrains, and grains. The MS will also be described later in more detail.

The phrase "change in microstructure" refers to a change in MS. A change in MS occurs in connection with phenomena (metallurgical phenomena) such as solid solution, precipitation, recovery, and/or recrystallization. Examples of a change in MS include changes in solute elements, changes in second phase particles, changes in subgrains, and changes in grains.

As will be described later, according to the information processor 1, it is possible to calculate a change over time in MS from the time at which a certain process step starts to the time at which the certain process step ends. Then, the MS obtained through the above calculation, at the time at which the certain process step ends, can be used as an initial MS in the next process step. This makes it possible to find a final MS (the MS at the point in time in which the last process step completes), with regard to Al manufactured through a plurality of different process steps. That is, it is possible to predict material properties of Al which is an end product.

This makes it possible to set PCs based on the predicted material properties of Al, and thus possible to effectively control the properties of end products. For example, it becomes possible to prevent or reduce variations in strength of end products, prevent or reduce cracking in material surfaces during hot extrusion, and the like. It is also possible to prevent or reduce troubles resulting from MSs during each process step. This makes it possible to manufacture higher quality Al.

Examples of an aluminum product whose final MSs (i.e., material properties) can be predicted with use of the information processor 1 include aluminum sheet materials (rolled materials), aluminum foil materials, extruded aluminum materials, and forged aluminum materials. Examples of process steps for manufacture of such an aluminum product include steps described in the following sections 1 to 4.

1. Examples of Process Steps in a Case of Aluminum Sheet Material (Rolled Material)

Dissolution step, degassing step, casting step, continuous casting step, homogenization treatment step, hot rough rolling step, hot finishing rolling step, cold rolling step, solution heat treatment step, aging treatment step, correction step, annealing step, and surface treatment step 2. Examples of Process Steps in a Case of Aluminum Foil Material Dissolution step, degassing step, casting step, continuous casting step, homogenization treatment step, hot rough rolling step, hot finishing rolling step, cold rolling step, solution heat treatment step, aging treatment step, correction step, annealing step, surface treatment step, and foil rolling step 3. Examples of Process Steps in a Case of Extruded Aluminum Material Dissolution step, degassing step, casting step, homogenization treatment step, hot extrusion step, drawing step, solution heat treatment step, aging treatment step, correction step, annealing step, surface treatment step, and cutting step 4. Examples of Process Steps in a Case of Forged Aluminum Material Hot forging step (cast aluminum material, rolled aluminum material, or extruded aluminum material is used as a starting material), cold forging step, solution heat treatment step, aging treatment step, and annealing step Object to be Attained by Information Processor 1

In order to manufacture an Al product that has desired properties, it is necessary to optimally control microscopic metallic structures (i.e., MSs) inside a material. The size of MS is usually equal to or less than 500 µm. Furthermore, as described earlier, an MS changes under the influence of metallurgical phenomena (such as solid solution, precipitation, crystallization, plastic deformation, recovery, and recrystallization) that may occur inside the material due to (i) an addition of an element(s) to an Al alloy and (ii) processing strain or heat treatment during process steps.

A lot of theoretical investigation has conventionally been carried out with regard to controlling MSs. Therefore, many of the foregoing metallurgical phenomena have been formulated by specific mathematical formulas (theoretical formula or empirical formula). In such circumstances, when considering simple alloy constituents and simple process steps on the laboratory scale, it is easy to determine a policy for MS control (in other words, it is easy to determine processing conditions (PCs)).

However, in cases of an industrial process (industrial product), constituents of an Al alloy and process steps are both complex. Furthermore, a plurality of metallurgical phenomena occur concurrently in a material, and these phenomena affect changes in MS. In addition, a plurality of metallurgical phenomena are interactive. This has prevented easy determination of the policy for MS control in cases of an industrial process.

Furthermore, a change in MS in each process step is strongly affected by the MS in the previous process step. Therefore, in order to control an MS of an end product, it is necessary to control changes in MS in all the process steps.

However, according to conventional metallurgical theories, only a single phenomenon (metallurgical phenomenon) or only a single process step is taken into account in the foregoing formulation. Therefore, the conventional metallurgical theories are only capable of calculating a change in MS that would result from a single phenomenon or a change in MS that would occur in a single process step, and are not sufficient to calculate MSs in an industrial process.

Under such circumstances, a method most often used in determining PCs in an industrial process is to adjust PCs by trial and error. However, adjustment of PCs by trial and error is very costly (e.g., necessitates time, effort, and cost for test production).

For the purpose of reducing cost (reducing the number of times the trial-and-error is carried out), there has been proposed a method of predicting an MS by a theoretical method in regard to an industrial process. However, such a conventional method does not sufficiently take into account that, in a case where a plurality of metallurgical phenomena that cause changes in MS occur concurrently, what effects are imposed on changes in MS by the interactions between the metallurgical phenomena.

Furthermore, the conventional techniques do not provide any method that suffices in predicting an MS over a plurality of process steps. For example, according to the foregoing technique of Patent Literature 1, the number of microstructure factors used to predict a material property of an Al alloy sheet is small. As such, the technique of Patent Literature 1 is not sufficient in addressing complexity of a change in MS over a plurality of process steps.

In view of such circumstances, the inventors of the present invention (hereinafter "inventors") arrived at the information processor 1 in an attempt to reduce the cost for trial and error in an industrial process. Specifically, the information processor 1 is configured to be capable of calculating a change in MS over a plurality of process steps of an industrial process, as described below.

PC

The following description will discuss various kinds of data used in the information processor 1. Embodiment 1 is based on the assumption that process steps of an industrial process for manufacturing Al include the following N steps: first to N-th steps, where N is a natural number that satisfies N≥2. Also note that the i-th one of the process steps is referred to as an i-th step, where i is a natural number that satisfies 1≤i≤N.

In Embodiment 1, a data set indicative of a processing condition (PC) in an i-th step is represented as PC(i). PC(i) may be referred to as processing condition information. PCs(i) (in other words, PC(1) to PC(N)) are preset in the information processor 1 by a user input.

Examples of information (data, set values) contained in a PC(i) include, but are not limited to, the following 1 to 5. As described earlier, a PC(i) is not limited, provided that the PC(i) is set so that a TMP (more specifically, TMP(i, t) described later) can be found.

1. Examples of Information Contained in PC(i) for Hot Rough Rolling Step

Material properties of workpiece, slab dimensions (width, thickness, length), starting temperature, end temperature, number of passes, material dimensions (width, thickness, length) for each pass, rolling reduction for each pass, rolling time for each pass, holding time between successive passes, rolling speed for each pass, work roll diameter, amount of coolant, and the like 2. Examples of Information Contained in PC(i) for Hot Finishing Rolling Step Material properties of workpiece, number of passes, starting temperature, end temperature, material dimensions (width, thickness, length) for each pass, rolling reduction for each pass, rolling time for each pass, holding time between successive passes, rolling speed in each pass, work roll diameter for each pass, size of wound coil, rate of cooling after winding, spool diameter, and the like.

3. Examples of Information Contained in PC(i) for Cold Rolling Step

Material properties of workpiece, number of passes, starting temperature, end temperature, material dimensions (width, thickness, length) for each pass, rolling reduction for each pass, rolling time for each pass, holding time between successive passes, rolling speed for each pass, work roll diameter, size of wound coil, rate of cooling after winding, spool diameter, and the like.

4. Examples of Information Contained in PC(i) for Hot Extrusion Step

Material properties of workpiece, container shape, product shape, starting container temperature, starting die temperature, starting billet temperature, ram speed, extrusion rate, and the like.

5. Examples of Information Contained in PC(i) for Homogenization Treatment Step

Ingot dimensions (width, thickness, length), rate of temperature increase, holding temperature, holding time, cooling rate, cooling time, and the like

TMP

The time that has passed from the start of an i-th step is represented as "t". "t=0" represents the time at which the i-th step starts. Note that, for distinction between different steps, a time t in an i-th step may be represented as "ti". For example, t1 is a time t in the first step.

A TMP(i, t) is a data set indicative of a temperature (processing temperature) T applied to Al at a time t in an i-th step, the amount of strain (or simply strain) ε applied to Al at the time t in the i-th step, and the rate of strain dε applied to Al at the time t in the i-th step. A TMP(i, t) may also be referred to as thermo-mechanical processing condition information.

Hereinafter, the temperature T, the amount of strain ε, and the rate of strain dε, which are contained in a TMP(i, t), may be represented as temperature T(i, t), amount of strain ε(i, t), and rate of strain dε(i, t), respectively. A TMP(i, t) serves as an indicator indicative of heat applied to Al and in what condition the Al is processed (processing condition for the Al), at a time t in an i-th step. A TMP(i, t) may be defined as a function of time t or may be defined as a data set corresponding to time t.

The temperature T, the amount of strain ε, and the rate of strain dε are each a parameter that is essential to predicting (finding) a change in MS of Al with high accuracy, as will be described later. Therefore, a TMP needs to contain these three kinds of data, i.e., temperature T, amount of strain ε, and rate of strain dε.

The temperature T is a parameter that significantly affects, for example, the following phenomena: precipitation (deposition), recovery, and recrystallization (metallurgical phenomena that can occur in process steps).

The amount of strain ε is a dominant parameter that determines what deformed microstructure is formed within a material in a step in which plastic deformation is applied to the material.

The rate of strain dε is a parameter that is important for hot working. This is because Al is a metal that is especially prone to dynamic recovery or recrystallization. Therefore, in order to find a change in MS of Al with high accuracy, not only the temperature T and the amount of strain ε but also the rate of strain dε needs to be taken into account.

As has been described, a PC(i) set by a user input is set so that a TMP(i, t) can be found. Therefore, the information processor 1 finds a TMP(i, t) based on a PC(i).

The method in accordance with Embodiment 1 can be applied to any process step, provided that a TMP can be found for that process step. Therefore, the information processor 1 can be configured to be capable of conducting a desk study on any process step. A method of finding a TMP(i, t) based on a PC(i) may be selected appropriately according to the process step. Examples thereof are provided in the following sections 1 to 3.

1. Method of Finding TMP(i, t) for Homogenization Treatment Step

A homogenization treatment is a kind of heat treatment step. Therefore, in a case where an i-th step is a homogenization treatment step, no external forces for processing Al are applied. Thus, the amount of strain ε and the rate of strain dε can each be considered 0 (zero) at each time t. That is, ε(i, t) can be set to 0 and dε(i, t) can be set to 0.

Therefore, in the homogenization treatment step, it is only necessary to take into account a change over time in temperature T. That is, it is only necessary to find the temperature T(i, t)=T(t). For example, assume a case in which data of each of the following for the homogenization treatment step is contained in a PC(i): starting temperature Ts (° C.), rate of temperature increase Hu (° C./s), holding temperature Th (° C.), holding time th (s), cooling rate Hd (° C./s), and end temperature Te (° C.) (see also FIG. 6 which will be discussed later).

In the above case, temperatures T(t) in the following respective substeps of the homogenization treatment step, i.e., temperature increase→temperature retention (holding)→cooling, can be approximated by the following equations (1).

$$\begin{cases} T(t) = T_s + tH_v & \left(0 \leq t \leq \dfrac{T_h - T_s}{H_u}\right) \\ T(t) = T_h & \left(\dfrac{T_h - T_s}{H_u} \leq t \leq \dfrac{T_h - T_s}{H_u} + t_h\right) \\ T(t) = \left(\dfrac{\dfrac{T_h - T_s}{H_u} + }{t_h + \dfrac{T_e - T_h}{H_d}}\right) H_d - tH_d & \left(\dfrac{T_h - T_s}{H_u} + t_h \leq t \leq \dfrac{T_h - T_s}{H_u} + t_h + \dfrac{T_e - T_h}{H_d}\right) \end{cases} \quad (1)$$

In equations (1), temperatures T(t) in the homogenization treatment step are approximated by three linear functions (direct functions). The topmost one of equations 1 represents a temperature T(t) when heating is carried out, the middle one of equations 1 represents a temperature T(t) when temperature is maintained, and the bottommost one of equations 1 represents a temperature T(t) when cooling is carried out. Substitution of a specific time t into any of equations (1) gives a temperature T(t) at that time t.

Note that the equations that approximate temperatures T(t) in the homogenization treatment step are not limited to equations (1). For example, in a case where the temperature of Al is directly measured at certain time intervals, the measured temperatures at respective time points may be supplied to the information processor 1 (more specifically, to an i-th step calculating section, which will be described later).

In the above case, the information processor 1 may carry out a known interpolation process to interpolate between the time points, thereby representing temperature T(t) by a function of a desired kind (e.g., linear function or non-linear function).

2. Method of Finding TMP(i, t) for Cold Rolling Step

For example, assume a case in which data of work roll diameter, data of sheet thickness, and data of rolling speed, for a cold rolling step, are contained in a PC(i). In this case, the amount of strain ε and the rate of strain dε, when rolling is carried out, can each be found based on the theory of rolling (i.e., using a theoretical formula based on the theory of rolling).

For example, the amount of strain ε and the rate of strain dε can be found using the following equations (2):

$$\begin{cases} \varepsilon = 1.15 \times \ln\left(\dfrac{h_{in}}{h_{out}}\right) \\ d\varepsilon = \dfrac{\varepsilon V_r}{\sqrt{R_r(h_{in} - h_{out})}} \end{cases} \quad (2)$$

where hin (m) represents a sheet thickness at the entrance side, hout (m) represents a sheet thickness at the exit side, Rr (m) represents the radius of a roll, and Vr (m/s) represents rolling speed.

If the data about the time t at which a material passes over the roll is also contained in the PC(i), the amount of strain ε and the rate of strain dε in equations (2) can be represented as ε(i, t) and dε(i, t), respectively. That is, the amount of strain ε and the rate of strain dε can each be represented as a function of time t.

Note that, in a case where a simple calculation is carried out with regard to the cold rolling step, room temperature may be used as the temperature T. Note, however, that, in cases of some products, a change in MS that would arise from heat resulting from processing is preferably taken into account. In this case, the temperature T is also preferably represented as a function of time t: T(t).

However, finding the temperature T(t) for the cold rolling step with high accuracy, using theoretical formulas, is not always easy. In view of this, the PC(i) preferably contains temperatures before and after the cold rolling step (i.e., the temperature at the start of the cold rolling step and the temperature at the end of the cold rolling step). In this case, with use of the temperatures before and after the cold rolling step, a change over time in temperature T in the cold rolling step can be roughly represented by an approximate expression.

3. Method of Finding TMP(i, t) for Hot Extrusion Step

With regard to the hot extrusion step, it is not always easy to find a TMP using only a simple formula, because the geometric configuration of a material in the hot extrusion step is complex. However, provided that data of container diameter, data of extrusion rate, data of product shape, and the like are contained in a PC(i), a TMP can be found using an FEM.

MS Information

An MS(i, t) is a data set indicative of MS information at a time t in an i-th step. An MS(i, t) may also be referred to as microstructure information. For example, an MS(i, t) may contain data of the following: the amount of main alloying element(s), the amount of main solute alloying element(s), average radius of representative (typical) second phase particles and number density of the particles, recrystallization ratio, grain diameter, and strain energy.

As used herein, the term "strain energy" refers to the total free energy of subgrains within a material. The subgrains form due to dislocations resulting from processing or due to rearrangements of dislocations resulting from heat.

It is preferable that an MS(i, t) further contains data indicative of a particle size distribution of representative second phase particles. This is because the effects of the second phase particles on a change in MS differ depending on the particle size of the second phase particles. Therefore, by using not only the average radius and number density of second phase particles but also the particle size distribution of the second phase particles, it is possible to find an MS with high accuracy.

It is further preferable to use an MS(i, t) of a recrystallized portion of a material (Al) and an MS(i, t) of a non-recrystallized portion of the material (Al) which are individual pieces of information. That is, it is preferable that an MS(i, t) of a material in a recrystallized state and an MS(i, t) of the material in a non-recrystallized state are dealt with as different pieces of information (different data sets).

A reason therefor is as follows. In a calculation which combines a plurality of process steps, in many cases, at the completion of a calculation for a certain process step (i-th step), the result of the calculation, which is about a material containing both a recrystallized portion and a non-recrystallized portion, is given to the next step calculating section ((i+1)-th step calculating section) which carries out a calculation for the next process step ((i+1)-th step).

In this case, calculation accuracy can be improved more in a case where an MS(i, t) of a recrystallized portion and an MS(i, t) of a non-recrystallized portion are dealt with as individual pieces of information than in a case where an MS(i, t) is the average (average information) of those for the recrystallized portion and non-recrystallized portion.

For example, whether a material is recrystallized or not greatly affects the rate of precipitation in the material and how deformed microstructures form in the material. That is, the manner in which each of the metallurgical phenomena changes over time can greatly differs between recrystallized and non-recrystallized portions of a material. Therefore, when an MS(i, t) of a recrystallized portion and an MS(i, t) of a non-recrystallized portion are dealt with as individual MSs(i, t), it is possible to predict a microstructure more accurately.

Furthermore, MSs(i, t), for all the process steps (first to N-th steps), are defined by common items (in other words, defined by formats of the same kind or by data structures of the same kind). This makes it possible for the information processor 1 (more specifically, the inter-step information integration section 11) to easily transfer an MS(i, tfi), which is acquired from an i-th step calculating section (described later), to an (i+1)-th step calculating section (described later). For example, it is possible to easily transfer MS(1, tf1)=MS(2, 0) from a first step calculating section 12a to a second step calculating section 12b (which are described later).

Configuration of Information Processor 1

FIG. 1 is a functional block diagram illustrating a configuration of main parts of the information processor 1. The information processor 1 includes a control section 10, an input section 70, a display section 75, and a storage section 90.

The control section 10 carries out an overall control of various sections of the information processor 1. The function of the control section 10 may be realized by a central processing unit (CPU) executing a program(s) stored in the storage section 90. The storage section 90 stores various programs executed by the control section 10 and data used by the programs.

The control section 10 includes an inter-step information integration section 11, a step calculating section 12, and a microstructure calculating section 13. The step calculating section 12 includes N subordinate step calculating sections (step calculating subsections), i.e., a first step calculating section 12a to an N-th step calculating section 12N.

A step calculating subsection, which carries out a calculation for an i-th step, of the step calculating section 12 is referred to as an i-th step calculating section. For convenience of description, FIG. 1 illustrates a first step calculating section 12a, a second step calculating section 12b, and an N-th step calculating section 12N. Note that Examples (described later) show cases in which N=3.

The microstructure calculating section 13 includes a structure calculation module group 130. The structure calculation module group 130 includes modules (calculation modules) that calculate changes over time in a respective plurality of metallurgical phenomena.

The calculation modules included in the structure calculation module group 130 are, for example, a recrystallization module 130a, a solid solution/precipitation module 130b, a deformed microstructure module 130c, and a recovery module 130d.

The recrystallization module 130a finds a change over time in recrystallization of a material (Al). The solid solution/precipitation module 130b finds a change over time in solid solution/precipitation of the material. The deformed microstructure module 130c finds a change over time in deformed microstructure of the material. The recovery module 130d finds a change over time in recovery of the material.

Al is more prone to recovery than other metallic materials. Therefore, when the structure calculation module group 130 includes the recovery module 130d, it is possible to find changes over time in a respective plurality of interactive metallurgical phenomena in consideration of recovery of Al (which is a metallurgical phenomenon that is likely to occur in Al). This makes it possible to predict a microstructure more accurately.

Note, however, that the structure calculation module group 130 may include some other module(s). The structure calculation module group 130 makes it possible to calculate changes in MS that would result from a plurality of metallurgical phenomena.

The modules (e.g., recrystallization module 130a, solid solution/precipitation module 130b, deformed microstructure module 130c, and recovery module 130d) receive respective MSs(i, t) having a common data structure. For example, each of the modules receives an MS(i, t) that has the items shown in FIG. 7.

Since the inter-step information integration section 11, the step calculating section 12 (first step calculating section 12a to N-th step calculating section 12N), and the microstructure calculating section 13 (structure calculation module group 130) are provided, a change in microstructure of Al can be predicted, as described below (see also FIG. 2 which will be discussed later).

The input section 70 receives an input by a user (user input). As described earlier, PC(1) to PC(N) are set by a user input. Furthermore, MS(1, 0) (that is, initial values of microstructure information for the first step) is also set by a user input (see also FIG. 3 which will be discussed later).

The display section 75 displays each kind of data (especially the result calculated by the control section 10) in the form of a graph. The display section 75 may display an input screen for a user input. The display section 75 makes it possible to provide a graphic user interface (GUI) to a user, and thereby improve user convenience. Note that, in a case where a touch panel is used as the input section 70 and the display section 75, the input section 70 and the display section 75 can be integrally configured.

(Inter-Step Information Integration Section 11)

Figure 2:
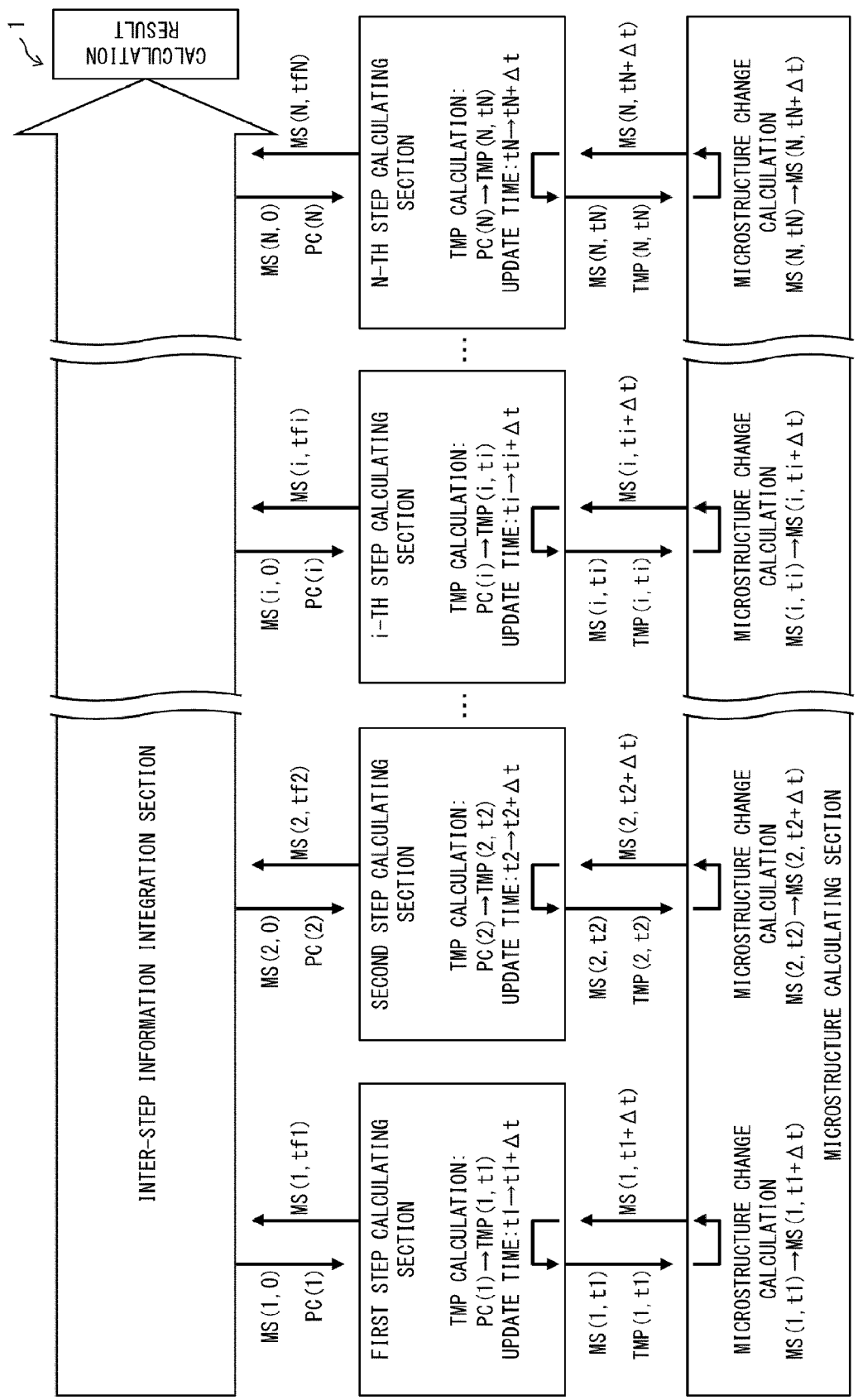
FIG. 2 illustrates an example of an overall process flow in the information processor of FIG. 1.
Figure 3:
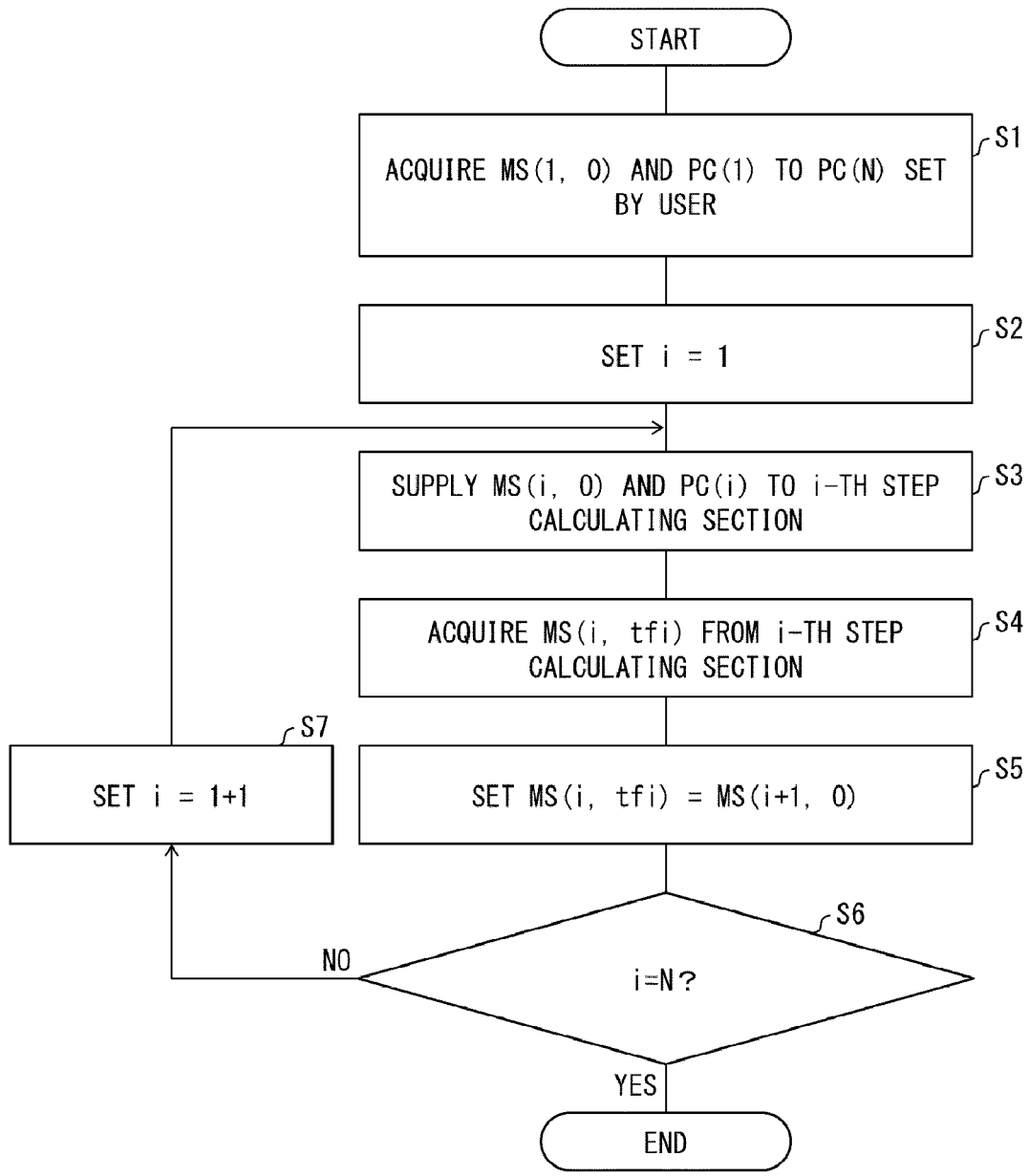
FIG. 3 shows an example of a flow of steps carried out by an inter-step information integration section of the information processor of FIG. 1.

FIG. 2 illustrates an example of an overall process flow in the information processor 1. FIG. 2 schematically illustrates data and process flows among the inter-step information integration section 11, the step calculating section 12, and the microstructure calculating section 13. FIG. 3 is a flowchart showing an example of a flow of steps S1 to S7 carried out by the inter-step information integration section 11. The following description will discuss how the inter-step information integration section 11 operates, based on FIG. 3 with reference to FIG. 2.

Note that, in FIG. 2, for distinction between the steps, a TMP(i, t) and an MS(i, t) for an i-th step are represented as a TMP(i, ti) and an MS(i, ti), respectively.

First, the inter-step information integration section 11 acquires MS(1, 0) and PC(1) to PC(N) set by a user (S1). Then, the inter-step information integration section 11 sets i to i=1 (S2), where i is a loop count in the process shown in FIG. 3.

Figure 4:
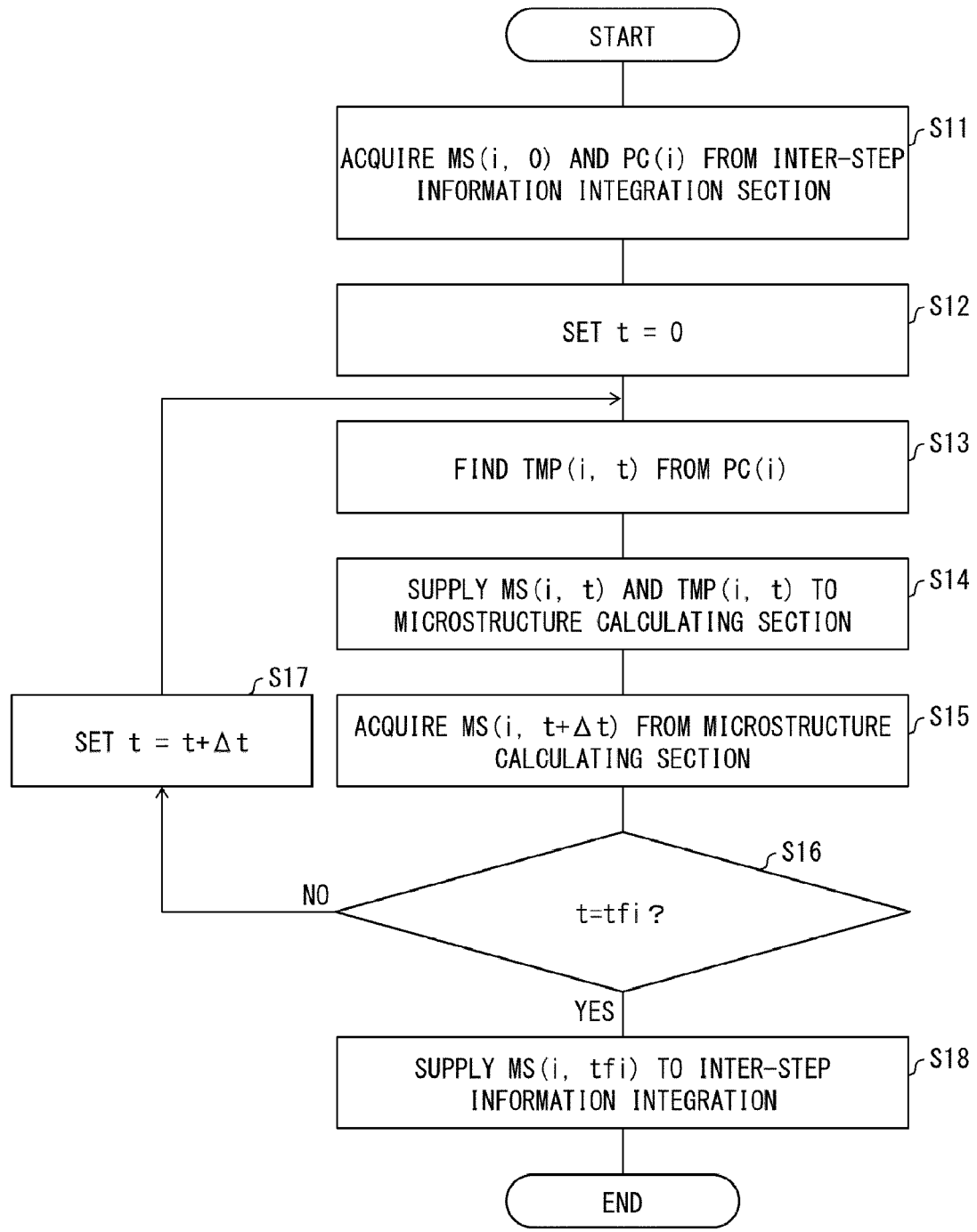
FIG. 4 shows an example of a flow of steps carried out by an i-th step calculating section of the information processor of FIG. 1.

Next, the inter-step information integration section 11 supplies an MS(i, 0) and a PC(i) to an i-th step calculating section (S3). How the i-th step calculating section acquires an MS(i, tfi) is shown in FIG. 4 (discussed later). The tfi is the time at which the i-th step ends. The tfi may be preset or may be set so that it can be changed by the i-th step calculating section.

For example, in a case where i=1, the inter-step information integration section 11 supplies the MS(1, 0) and PC(1) to the first step calculating section 12a (see the arrow extending from the inter-step information integration section toward the first step calculating section in FIG. 2). In this case, the first step calculating section 12a acquires the MS(1, 0) and PC(1), and finds MS(1, tf1).

Next, the inter-step information integration section 11 acquires the MS(i, tfi) from the i-th step calculating section (S4). For example, in a case where i=1, the inter-step information integration section 11 acquires the MS(1, tf1) from the first step calculating section 12a (see the arrow extending from the first step calculating section toward the inter-step information integration section in FIG. 2).

Next, the inter-step information integration section 11 sets an MS(i+1, 0) based on MS(i, tfi)=MS(i+1, 0) (S5). Specifically, the inter-step information integration section 11 sets, as microstructure information at the start of the (i+1)-th step (next step), microstructure information at the completion of the i-th step.

Then, the inter-step information integration section 11 determines whether or not i=N (S6). Specifically, the inter-step information integration section 11 determines whether the i-th step, for which a calculation is currently being carried out, is the last step (N-th step) or not.

If i is not N (NO in S6), the inter-step information integration section 11 sets i=i+1 (S7). Specifically, the inter-step information integration section 11 increments the value of i by one. Then, the process returns to S3 for another cycle.

For example, assume that i=1. In this case, in S5, the inter-step information integration section 11 sets MS(2, 0) based on MS(1, tf1)=MS(2, 0). Next, the inter-step information integration section 11 sets i as i=2, and the process returns to S3.

Then, in S3, the inter-step information integration section 11 supplies the MS(2, 0) (=MS(1, tf1)) and PC(2) to the second step calculating section 12b (see the arrow extending from the inter-step information integration section toward the second step calculating section in FIG. 2).

Next, in S4, the inter-step information integration section 11 acquires an MS(2, tf2) from the second step calculating section 12b (see the arrow extending from the second step calculating section toward the inter-step information integration section in FIG. 2). The same operations are carried out in the third and subsequent steps.

Then, the value of i is incremented one by one, and, when i=N is reached (YES in S6), the inter-step information integration section 11 ends the process. The inter-step information integration section 11 may output, as the final results of calculation, all pieces of microstructure information obtained through the calculations for the first to the N-th steps.

Alternatively or additionally, the inter-step information integration section 11 may output, as the final results of calculation, all pieces of thermo-mechanical processing condition information obtained through the calculations for the first to the N-th steps. A piece of thermo-mechanical processing condition information (TMP(i, t)) is found by each i-th step calculating section, as will be described later.

The inter-step information integration section 11 may cause the display section 75 to selectively display only some of the final results of calculation (e.g., the result of calculation a user wants to see) in accordance with a user input. The inter-step information integration section 11 may store each result of calculation into the storage section 90 during the foregoing process.

Note that the storage section 90 may store therein data indicative of an MS of an actual material pre-measured by a user (such data is hereinafter referred to as measured MS data) (measured information). The inter-step information integration section 11 may use the measured MS data to evaluate an MS found under the same processing condition (PC(i)) as that for the material on which the measured MS data was obtained.

More specifically, the inter-step information integration section 11 may find an error between an MS(i, t) and the measured MS data and thereby evaluate the error (hereinafter "calculation error") of the MS(i, t). Furthermore, the inter-step information integration section 11 may adjust a parameter(s) (e.g., coefficient(s)) for use in calculations by the step calculating section and the microstructure calculating section so that calculation error will be reduced. In this manner, the inter-step information integration section 11 preferably has the function of improving calculation accuracy using measured MS data.

Note that the measured MS data does not need to contain measured values corresponding to all the MS items (see FIG. 7 which will be discussed later), provided that the measured MS data contains a measured value(s) corresponding to at least one of the MS items.

Step Calculating Section 12

FIG. 4 is a flowchart showing an example of a flow of steps S11 to S18 carried out by an i-th step calculating section included in the step calculating section 12. The following description will discuss how the i-th step calculating section operates, with reference to FIG. 4.

Assume here that the value of i in FIG. 4 is preset by the inter-step information integration section 11 in the foregoing step S2. This is the same also in FIG. 5 which will be discussed later. That is, FIGS. 4 and 5 each show a process carried out in a predetermined i-th step.

First, the i-th step calculating section acquires an MS(i, 0) and a processing condition PC(i) from the inter-step information integration section 11 (S11). Note that, as described earlier, the MS(i, 0) is equal to an MS(i−1, tfi).

Next, the i-th step calculating section sets the time t (time ti) in the i-th step to t=0 (start time, initial time) (S12). Then, the i-th step calculating section finds a TMP(i, t) based on the PC(i) (S13). For example, assume that i=1 and t=t1=0. In this case, the first step calculating section 12a supplies MS(1, 0) to the microstructure calculating section 13 (see also FIG. 2).

Note that, as described earlier, a TMP(i, t) in the i-th step calculating section may be found by a method that varies depending on the process step. For example, in a case of an annealing step or the like, it is possible to set, from a furnace temperature setting program, a mathematical formula that simply simulates temperature history. In a case of a rolling step, a drawing step, or the like accompanying relatively simple plastic working, a mathematical formula can be set based on the theory of rolling or theory of material mechanics. In such cases, the i-th step calculating section can find a TMP(i, t) using such a mathematical formula.

Alternatively, in a case of a complex step such as forging or extrusion, a TMP(i, t) may be found in the i-th step calculating section by using a simulation technique such as an FEM.

Then, the i-th step calculating section supplies the MS(i, t) and the TMP(i, t) to the microstructure calculating section 13 (S14). For example, in a case where i=1 and t=t1=0, the first step calculating section 12a supplies MS(1, 0) and TMP(1, 0) to the microstructure calculating section 13 (see also FIG. 2).

Next, the i-th step calculating section acquires an MS(i, t+Δt) from the microstructure calculating section 13 (S15). For example, in a case where i=1 and t=t1=0, the first step calculating section 12a acquires an MS(1, Δt) from the microstructure calculating section 13 (see also FIG. 2). Note that Δt is an infinitesimal time period. The value of Δt may be set by the microstructure calculating section 13.

Note that the value of Δt may be constant or inconstant. For example, the value of Δt may be set differently from one i to another. Alternatively, the value of Δt for the same i may be changed during a calculation.

Next, the i-th step calculating section determines whether or not t=tfi (S16). Specifically, the i-th step calculating section determines whether or not the time t has reached the time at which the i-th step ends.

If t is not tfi (NO in S16), the i-th step calculating section sets t=t+Δt (S17). Specifically, the i-th step calculating section increments (advances) the time t in the i-th step by Δt. Then, the process returns to S13 for another cycle.

On the contrary, if t=tfi (YES in S16), the i-th step calculating section supplies the MS(i, tfi) to the inter-step information integration section 11 (S18) (see also the foregoing S4 and S5 of FIG. 3). For example, in a case where i=1 and t=t1=0, the first step calculating section 12a supplies MS(1, tf1) to the inter-step information integration section 11.

As has been described, the i-th step calculating section finds a TMP(i, t) based on a PC(i). The i-th step calculating section then causes the microstructure calculating section 13 to find MSs(i, t+Δt) sequentially one by one, and acquires the MS(i, tfi) from the microstructure calculating section 13.

Then, as described earlier, the inter-step information integration section 11 acquires the MS(i, tfi) from the i-th step calculating section, and supplies the MS(i, tfi), as an MS(i+1, 0), to the (i+1)-th step calculating section. In this way, the inter-step information integration section 11, upon completion of a calculation for the i-th step by the i-th step calculating section, causes the (i+1)-th step calculating section to start a calculation for the (i+1)-th step (the next process step).

Micro-Structure Calculating Section 13

Figure 5:
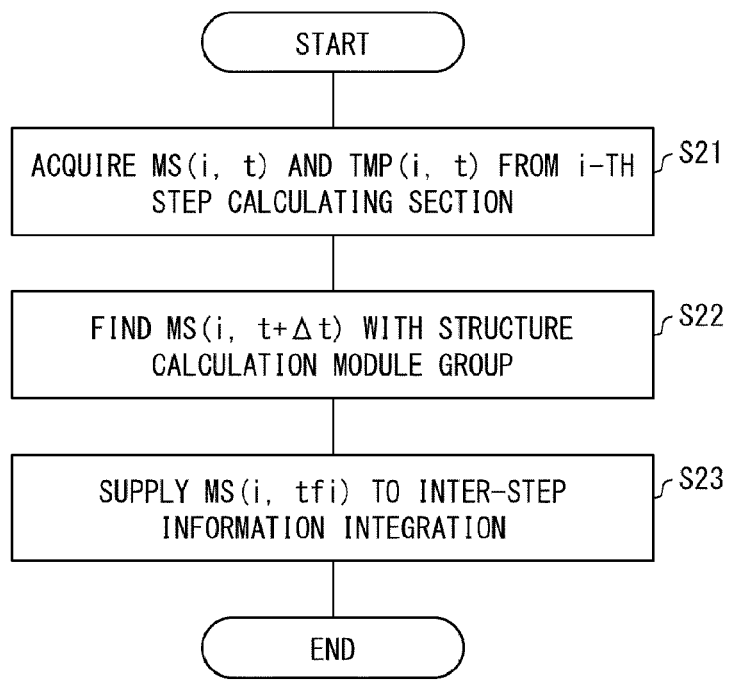
FIG. 5 shows a flow of steps carried out by a microstructure calculating section of the information processor of FIG. 1.

FIG. 5 is a flowchart showing a flow of steps S21 to S23 carried out by the microstructure calculating section 13. The following description discusses how the microstructure calculating section 13 operates, with reference to FIG. 5.

First, the microstructure calculating section 13 acquires an MS(i, t) and a TMP(i, t) from an i-th step calculating section (S21). Next, the microstructure calculating section 13 finds an MS(i, t+Δt) based on the MS(i, t) and TMP(i, t) through use of the structure calculation module group 130 (S22).

Then, the microstructure calculating section 13 supplies the thus-found MS(i, t+Δt) to the i-th step calculating section (S23).

The structure calculation module group 130 has the function of, with use of the current thermo-mechanical processing condition (TMP(i, t)), finding (predicting) microstructures (MS(i, t+Δt)) in an infinitesimal time period Δt from the current microstructures (MS(i, t)).

The modules of the structure calculation module group may calculate (predict) changes over time in MS, which would result from respective metallurgical phenomena, by a calculation technique using a known method (e.g., a known theoretical formula or a known empirical formula for prediction of MS). That is, each of the modules may predict a change in MS using a predetermined model (calculation model, physical model). Note, however, that a method of predicting an MS by each module is not particularly limited. The structure calculation module group may use any calculation technique, provided that it is possible to predict a change in MS.

For example, the recrystallization module 130a may employ a method disclosed in "Acta Materialia 51 (2003) 1453-1468", the solid solution/precipitation module 130b may employ a method disclosed in "Acta Materialia 45 (1997) 4231-4240, and the deformed microstructure module 130c may employ a method disclosed in "Journal of Materials Processing Technology 117 (2001) 333-340".

The modules cross-reference microstructure parameters necessary for their calculations. For example, in a case where the recrystallization module 130a calculates recrystallization, information on second phase particles is essential. The recrystallization module 130a therefore refers to a solid solution/precipitation condition calculated by the solid solution/precipitation module 130b, and uses it as information on second phase particles.

In order for grain boundary precipitation to be taken into account in a solid solution/precipitation calculation carried out by the solid solution/precipitation module 130b, a grain structure calculated by the recrystallization module 130a is necessary. The solid solution/precipitation module 130b therefore refers to a grain structure calculated by the recrystallization module 130a, and calculates solid solution/precipitation.

When the modules carry out calculations at intervals of an infinitesimal time period Δt, it is possible to calculate a change over time in MS in a manner that takes into account the interaction between a plurality of metallurgical phenomena. That is, changes over time in a plurality of interactive metallurgical phenomena can be found, and thereby an MS(i, t+Δt) can be obtained. Note that, if the Δt is large, it is not possible to calculate a change over time in microstructure with good accuracy. The Δt therefore needs to be set (selected) at a relatively small value.

Note, here, that a specific microstructure parameter (a variable that represents the state of a microstructure), for use in calculation by the structure calculation module group 130, is represented as Z(t). The Δt may be set in consideration of the amount of change in Z(t) over a duration from time t to time t+Δt.

For example, the Δt may be set so that the amount of change from Z(t) to Z(t+Δt) is not more than 0.5%. That is, the Δt may have any value, provided that it is set so that a change over time from Z(t) to Z(t+Δt) is relatively small.

Note that the Δt is not set by a specific one Z (single microstructure parameter) or by a single module. The Δt is determined by the Z whose change in a time domain is largest of all the Zs used in the structure calculation module group 130 (all the modules). In this manner, the Δt is set with respect to the Z whose change is largest, and thereby the interactions between a plurality of phenomena can be taken into full account.

Effect Provided by Information Processor 1

According to the information processor 1, it is possible to find MSs(i, t) with regard to various PCs(i) (processing conditions). That is, it is possible to predict a change in MS that would occur as each step progresses. This makes it possible to predict an MS obtained at the completion of manufacture of a product (Al) (i.e., MS(N, tfN)) more accurately than conventional techniques. That is, it is possible to predict a microstructure of Al in an industrial process more accurately than conventional techniques.

Therefore, for example, by carrying out a calculation with a varied parameter (processing parameter) contained in a PC(i) within a certain condition range, it is possible to know what effect is placed by that processing parameter on the MS, in a systematic manner.

Furthermore, by designating condition ranges for respective processing parameters and carrying out repeating calculations with randomly varying processing parameters within the respective condition ranges, it is also possible to search for a PC(i) for obtaining a desired MS.

As has been described, according to the information processor 1, it is possible to set PCs(i) so that properties attributed to an MS are stabilized. This makes it possible to significantly reduce the number of times trial-and-error is carried out and significantly reduce cost in regard to an industrial process.

Furthermore, according to the information processor 1, it is possible to cause the microstructure calculating section 13 to carry out a calculation with use of MSs(i, t) having a common data structure (this will be described in detail in the following Examples). Advantages of such an arrangement will be described below based on Examples.

EXAMPLES

Assume an Al sheet material (product) of H1n temper manufactured through process steps of "casting step→homogenization treatment step→hot rough rolling step→hot finishing rolling step→cold rolling step". The following provides an example in which calculations by the information processor 1 were used in order to stabilize the strength of the product after the cold rolling.

In a case of a product of H1n temper, the product strength after cold rolling depends strongly on alloy constituents and the rolling reduction in cold rolling. Note, however, that the product strength after cold rolling is known to be affected also by the recrystallization ratio after hot finishing rolling.

The alloy constituents and the rolling reduction in cold rolling can be easily controlled as PCs. On the contrary, the recrystallization ratio after hot finishing rolling cannot be easily controlled stably, and this is one of the causes of variations in product strength. In view of this, the inventors carried out, with use of the information processor 1, prediction of an MS after "homogenization treatment step→hot rough rolling step→hot finishing rolling step", and studied how to stabilize the product strength.

The inventors employed the following continuous three steps in their calculations: "homogenization treatment step→hot rough rolling step→hot finishing rolling step". Specifically, the inventors employed the homogenization treatment step as a first step, the hot rough rolling step as a second step, and the hot finishing rolling step as a third step (i.e., N=3), and carried out calculations with the use of the information processor 1.

FIG. 6 shows items of PCs in the present Example. Specifically, FIG. 6 shows PC(1) (a data set of a PC for the homogenization treatment step), PC(2) (a data set of a PC for the hot rough rolling step), and PC(3) (a data set of a PC for the hot finishing rolling step).

Note that an MS of an Al ingot to be subjected to a homogenization treatment is given as MS(1, 0). The MS of the Al ingot was obtained based on manufacture instruction conditions and production records in a factory (this is described later).

These PCs were used to find TMPs for the respective steps. First, with regard to the TEP for the homogenization treatment step (first step), temperature T(t)=T(1, t) was calculated using the foregoing equations (1). As described earlier, the amount of strain ε(t)=ε(1, t) and the rate of strain dε(t)=dε(1, t) used here were both 0 (zero).

As for the hot rough rolling step (second step) and the hot finishing rolling step (third step), a temperature change during rolling is unknown. Therefore, temperatures T(t) (temperatures T(2, t) and T(3, t)) were found on the assumption that a rolling-induced temperature change occurs instantly.

With regard to the amounts of strain ε(t) (amount of strains ε(2, t) and ε(3, t)) and the rates of strain dε(t) (rates of strain dε(2, t) and ε(3, t)), it was assumed that a non-zero value occurs only at a point in time at which the sheet passes between reduction rolls. At the times except for the point in time at which the sheet passes between the reduction rolls, the amount of strain ε(t) and the rate of strain dε(t) were both set to 0 (zero).

The values of the amount of strain ε and the rate of strain dε were found based on the theory of rolling with use of rolling reduction, rolling speed, and roll diameter. In the hot finishing rolling step, the MS changes also during cooling after a material is coiled up. The TMP for the hot finishing rolling step does not include processing; therefore, a change in temperature T(t) was found simply from the measured cooling rate.

FIG. 7 shows items of an MS in the present Example. The MS in FIG. 7 is the same among the first to third steps. A sample was taken from the ingot, a microstructure of the sample was observed, and an initial value (i.e., MS(1, 0)) of an MS for the first step (homogenization treatment step) was measured. Note that, because the initial state of the material in the first step is an ingot, the recrystallization ratio is 1 and the strain energy is 0 (zero).

Figure 8:
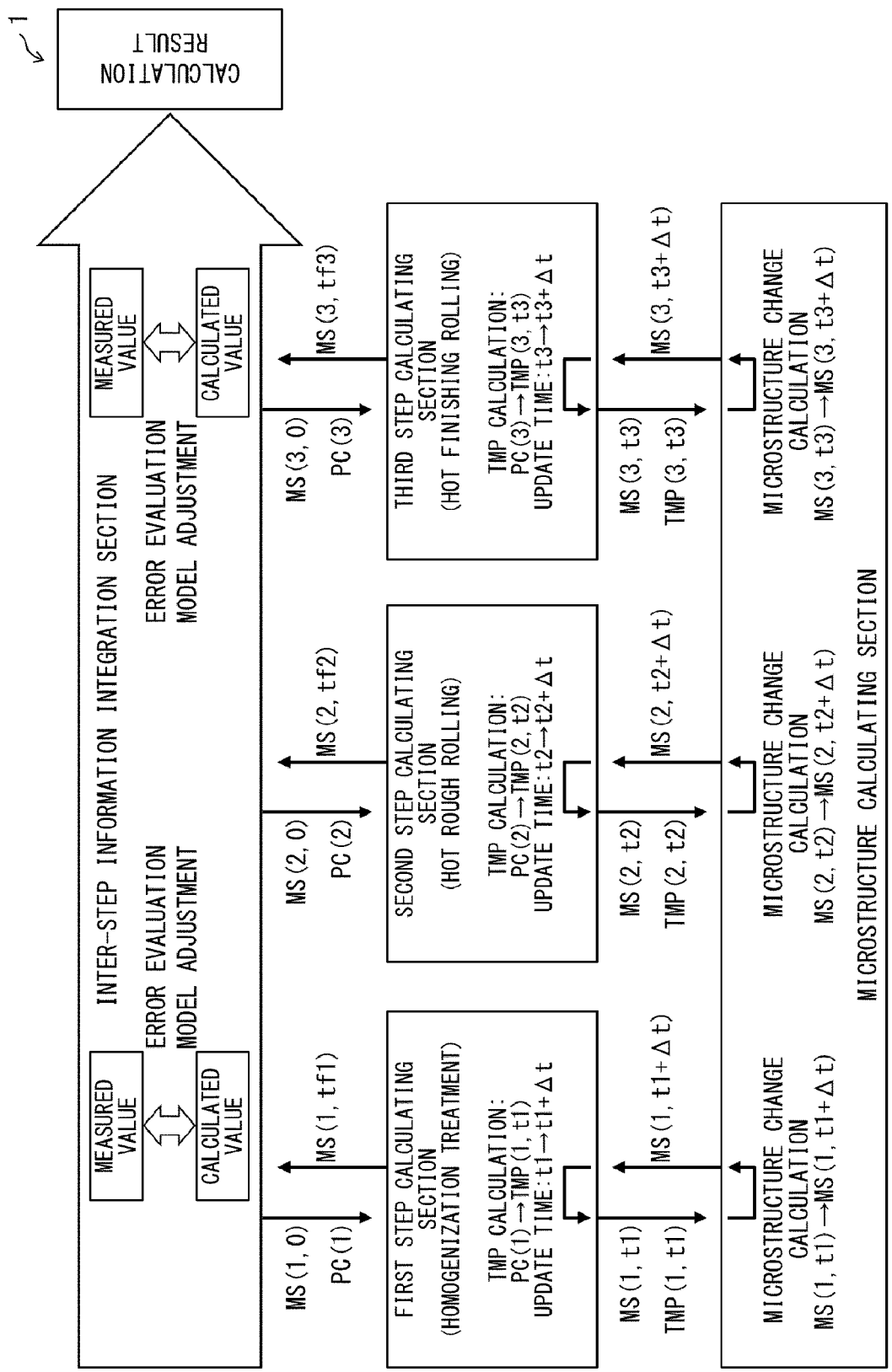
FIG. 8 shows an example of an overall process flow in the Example.

On the basis of the above data, the information processor 1 was used to calculate an MS. FIG. 8 shows an example of an overall process flow in the present Example. FIG. 8 corresponds to the arrangement shown in FIG. 3 where N=3.

For the purpose of acquiring measured data for use in adjusting a model (physical model, calculation model) for finding an MS, ten lots of factory's materials were extracted. Samples were taken from the factory's materials after the homogenization treatment step and after the hot finishing rolling step, and MSs were measured. Next, the following were quantified: (i) average particle radius Rp of a precipitate after the homogenization treatment step and (ii) recrystallization ratio Y and average grain diameter D of a recrystallized portion after the hot finishing rolling step.

These measured data were used to adjust the model. Note, here, that a microstructure factor for use in model adjustment is referred to as X. X is any one of the foregoing parameters Rp, D, and Y. Also, a measured value of X is referred to as Xexp, whereas a calculated value of X is referred to as Xcal.

In the present Example, in the information processor 1 (inter-step information integration section 11), an error evaluation value E for each X was found using the following equation (3). Then, the model (more specifically, a parameter(s) included in the model) was adjusted to minimize the mean Em of error evaluation values of the three parameters Rp, D, and Y.

$$E = \frac{2|X_{exp} - X_{cal}|}{X_{exp} + X_{cal}} \quad (3)$$

In Embodiment 1, learning with a Markov chain Monte Carlo method (MCMC method) was used to adjust the model. Note, however, that the adjustment of the model may be carried out by some other known technique. For example, the model may be adjusted without using learning.

FIG. 9 shows calculation results obtained using the foregoing adjusted model. The following are the meanings of symbols used in FIG. 9 for each lot.

Rexp: measured value of Rp
Rcal: calculated value of Rp
ERp: error evaluation value of Rp
Dexp: measured value of D
Dcal: calculated value of D
ED: error evaluation value of D
Yexp: measured value of Y
Ycal: calculated value of Y
EY: error evaluation value of Y
Em: mean of error evaluation values Note that Em=(ERp+ED+EY)/3. Furthermore, the mean of the values Em of ten lots is referred to as an overall error mean Emm. These symbols have the same meanings also in subsequent Comparative Example and Variation. If the overall error mean Emm is less than 0.2, it is expected that the prediction accuracy will be high enough to substitute for conventional trial and error that relies on a user's experience.

As shown in FIG. 9, in the present Example, the mean Em of error evaluation values of each lot was sufficiently small. Therefore, the overall error mean Emm was also small (0.08), which was much less than 0.2 (see the hatched cell in FIG. 9).

By finding an MS with a varied processing parameter, it is possible to obtain a calculated value Ycal of recrystallization ratio after hot finishing rolling that corresponds to that processing parameter. Thus, according to the information processor 1, it is possible to conduct a simulation study (desk study) on the product strength after cold rolling based on the value Ycal after hot finishing rolling.

FIG. 10 shows differences in calculation process between the present Example, a Comparative Example (described later), and Reference Examples (described later). As shown in FIG. 10, in the present Example, information sharing (data transfer) between the steps is carried out by the inter-step information integration section 11. The calculation of a TMP in each step is carried out by the step calculating section 12. The calculation of an MS in each step is carried out by the microstructure calculating section 13.

According to conventional techniques, in order to study product strength after cold rolling, there is no choice but to make about ten lots of sample materials at a factory and, by trial and error, search for processing conditions under which the recrystallization ratio after hot finishing rolling would be about 100%. For example, assuming that the cost for one ten-ton ingot for an Al rolled material is C (unit: Yen), a cost of about "C×K" will be necessary if the number of times the trial-and-error is carried out is K.

In contrast, as described earlier, according to the information processor 1, it is possible to predict an MS of Al in an industrial process more accurately than conventional techniques. This enables a highly accurate desk study, by which it is expected that the number of times the trial-and-error is carried out is reduced to, for example, equal to or less than half. Thus, it is possible to achieve cost reduction of, for example, "C×K/2" or more.

FIG. 11 shows comparisons between the present Example, Comparative Example, and Reference Examples. In the present Example, the inter-step information integration section 11 is capable of automatically supplying, to the step calculating section 12, information (PC(i) and MS(i, 0)) necessary for calculation. Therefore, the inter-step information integration section 11 is capable of causing the step calculating section 12 to carry out the calculations for all the steps (first step to N-th step). This makes it possible to reduce man-hour (man-hour for calculation). That is, it is possible to provide a calculation system (calculation program) superior in user usability.

Furthermore, according to the present Example, the inter-step information integration section 11 is capable of carrying out model adjustment that influences all steps, and is thus capable of optimizing calculation for all the steps as a whole. This makes it possible to also achieve high calculation accuracy.

Furthermore, according to the present Example, it is possible to cause the microstructure calculating section 13 to carry out calculations for all the steps with use of pieces of microstructure information (MSs(i, t)) having common items (common data structure). That is, MSs can be calculated by a common (single) microstructure calculating section 13. This eliminates the need for preparation of separate (different) microstructure calculation modules for respective steps, and thus makes it possible to significantly reduce the man-hour for development of a calculation system.

In the present Example, the study was carried out with regard to the three steps: "homogenization treatment step (first step)→hot rough rolling step (second step)→hot finishing rolling step (third step)". According to the configuration of the information processor 1, also in a case of studying some other step (forth step), it is only necessary to develop a step calculating section (fourth step calculating section) corresponding to such other step.

As such, a calculation system in accordance with an aspect of the present invention is a package (MS prediction package) that can be customized to suit for a step to be studied. This makes it easy to develop a program for some other step. Therefore, also in a case where various steps are to be studied, it is possible to significantly reduce the man-hour required for the development of a calculation system.

Comparative Example

Figure 13:
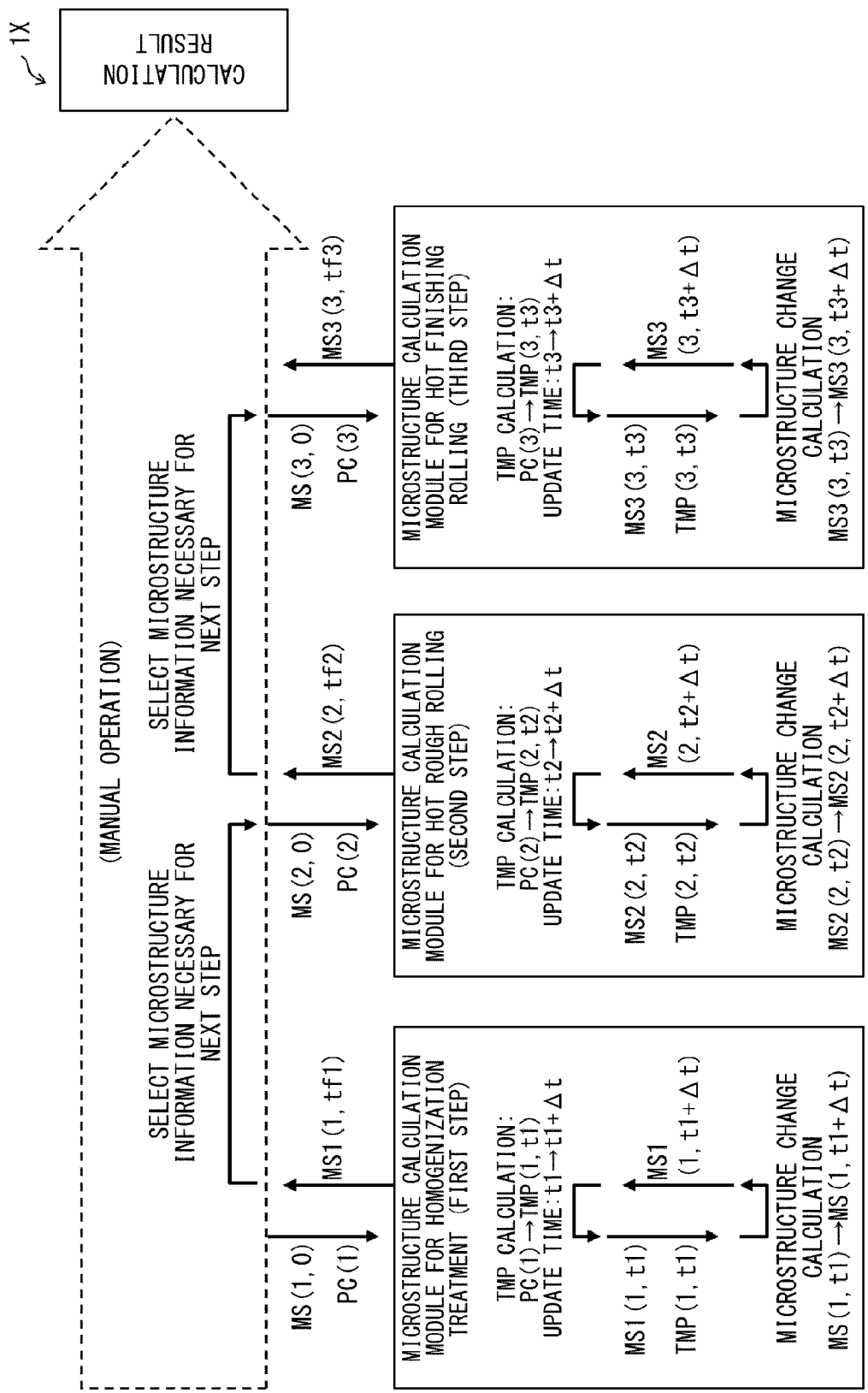
FIG. 13 illustrates an example of an overall process flow in the Comparative Example.

An example of a predictive calculation of an MS by a conventional technique is described below as a Comparative Example. In the Comparative Example, the same PCs and TMPs as those of the Example were used, and the same calculations as those described in the foregoing Example were carried out. FIG. 12 is a table showing items of an MS in the Comparative Example. FIG. 13 illustrates an example of an overall process flow in the Comparative Example.

As illustrated in FIG. 13, an information processor 1X in accordance with the Comparative Example includes: a microstructure calculation module (first microstructure calculation module) for a first step (homogenization treatment step); a microstructure calculation module (second microstructure calculation module) for a second step (hot rough rolling step); and a microstructure calculation module (third microstructure calculation module) for a third step (hot finishing rolling step).

That is, the information processor 1X includes individual microstructure calculation modules for the respective three steps. The information processor in accordance with the Comparative Example is different from the information processor 1 in this aspect. The microstructure calculation modules (first to third microstructure calculation modules) are each equipped with an algorithm of TMP calculation for a corresponding step and an algorithm of MS calculation for the corresponding step. Each of the microstructure calculation modules finds a TMP and an MS from a PC by the same method as described in the foregoing Example.

Furthermore, as illustrated in FIG. 13, the information processor 1X includes no inter-step information integration section 11. The information processor 1X is different from the information processor also in this aspect. According to the information processor 1X, data transfer, when calculation proceeds from a current i-th step (e.g., first step) to the next (i+1)-th step (e.g., second step), needs to be manually carried out by a user (see also FIGS. 10 and 11).

According to the information processor 1X, calculations are carried out by microstructure calculation modules which are independently provided for the respective steps. Therefore, the type of microstructure information used in calculation is different between the steps. Specifically, the values of recrystallization ratio, grain diameter, and strain energy are not used in the calculation carried out by the first microstructure calculation module (microstructure calculation module for homogenization treatment).

Therefore, as indicated in hatched cells in FIG. 12, the microstructure information for use in the first microstructure calculation module does not include the recrystallization ratio, grain diameter, and strain energy. Therefore, the first microstructure calculation module does not have the function of inputting/outputting the values of recrystallization ratio, grain diameter, and strain energy as microstructure information.

Therefore, in a case where microstructure information (MS(2, 0)) for calculation in the second step (hot rough rolling step) is transferred to the second microstructure calculation module, a user needs to manually select the values of recrystallization ratio, grain diameter, and strain energy. This means that, according to the information processor 1X, the man-hour required for MS calculation is greater than that of the information processor 1.

Moreover, according to the information processor 1X, pieces of information for the respective steps are dealt with independently of each other; therefore, model adjustment can be carried out only within each individual microstructure calculation module. That is, it is not possible to carry out model adjustment that influences all steps. Therefore, the Comparative Example is lower in calculation accuracy than the foregoing Example.

FIG. 14 shows calculation results obtained in the Comparative Example. As shown in FIG. 14, according to the Comparative Example, the mean Em of error evaluation values of each lot is much larger than that of the foregoing Example. In addition, the overall error mean Emm was also large (0.35), which was much larger than 0.2 (see the hatched cell in FIG. 14). That is, it was confirmed that the calculation in accordance with the Comparative Example cannot achieve prediction accuracy that can substitute for conventional trial and error.

Furthermore, according to the information processor 1X, it is necessary to design a microstructure calculation module (program) for each step; therefore, the man-hour required for program design is greater than that of the foregoing Example. For example, in a case where the information processor 1X is used in studying some other step (e.g., forth step), it is necessary to design a microstructure calculation module suitable for the fourth step. This indicates that the information processor 1X is much inferior to the information processor 1 in terms of customization for application to study on other steps.

Reference Example 1

Figure 15:
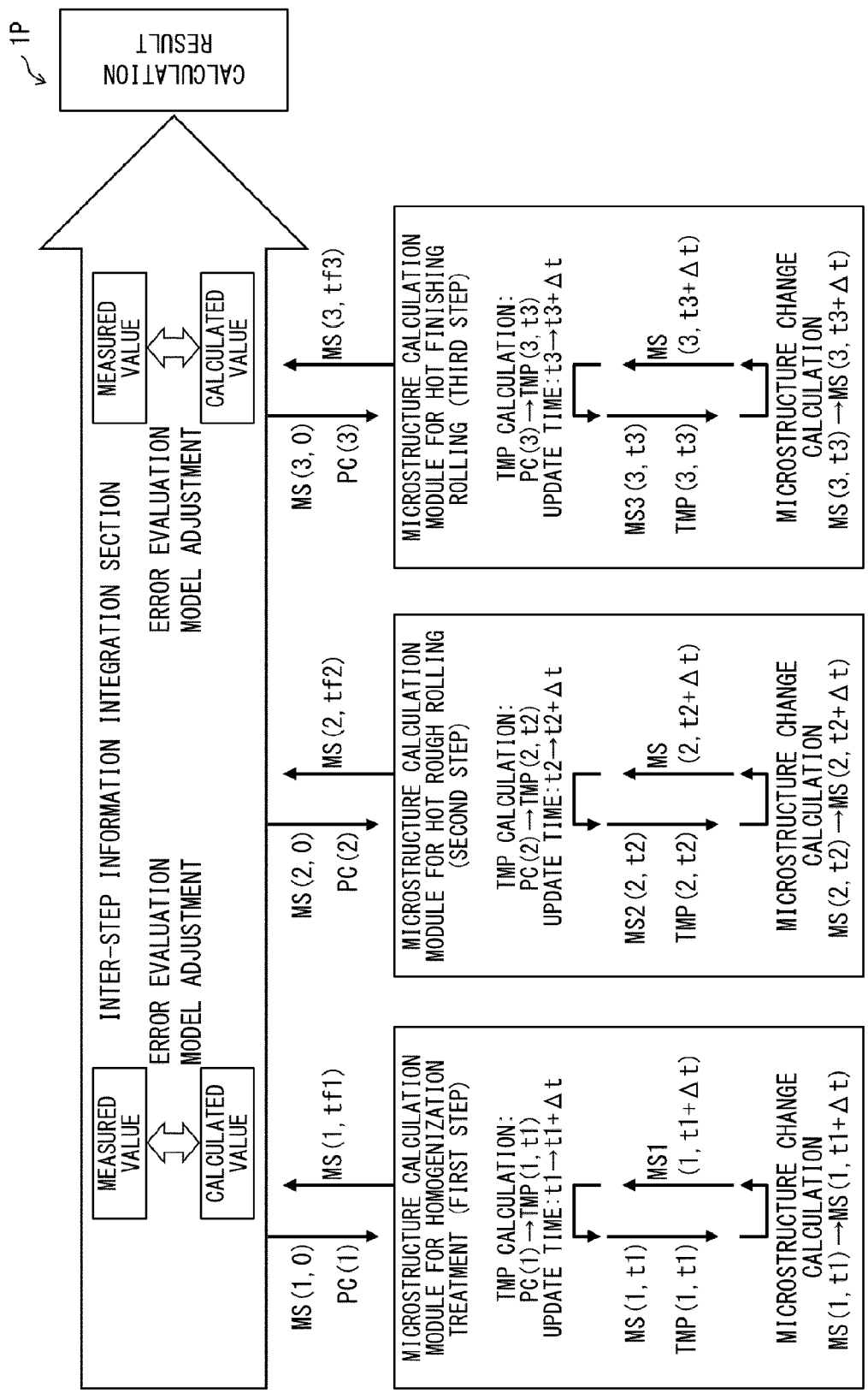
FIG. 15 illustrates an example of an overall process flow of Reference Example 1.

In Reference Example 1, the same PCs, TMPs, and MSs as those described in the foregoing Example were used, and the same calculations as described in the foregoing Example were carried out. FIG. 15 illustrates an example of an overall process flow of Reference Example 1. As illustrated in FIG. 15, an information processor 1P in accordance with Reference Example 1 is different from the information processor 1X of the Comparative Example in that the information processor 1P includes the inter-step information integration section 11 of the information processor 1. Note that the items of an MS in Reference Example 1 are the same as those of the Comparative Example (see FIG. 12).

Similarly to the foregoing Comparative Example, the values of recrystallization ratio, grain diameter, and strain energy are not used in a calculation carried out by the first microstructure calculation module (microstructure calculation module for homogenization treatment). Note, however, that, according to the information processor 1P, the inter-step information integration section 11 transfers, to the second microstructure calculation module, the values of recrystallization ratio, grain diameter, and strain energy as-is from the first microstructure calculation module.

Also in Reference Example 1, the inter-step information integration section 11 carries out model adjustment for each step, similarly to the foregoing Example. Note, however, that, because individual microstructure calculating sections are provided for the respective steps (i.e., the steps do not share a microstructure calculating section), the result of model adjustment in a certain step is not reflected in the other steps.

For example, in Reference Example 1, in the first step (homogenization treatment step), model adjustment is carried out so that the error between the measured average particle radius (Rexp) and calculated one becomes smaller; however, the result of this model adjustment is not reflected in the second step (hot rough rolling step) and the third step (hot finishing rolling step) (see also FIGS. 10 and 11).

According to Reference Example 1, the inter-step information integration section 11 automatically carries out information sharing between the steps, and therefore the man-hour required for MS calculation can be reduced as compared to the Comparative Example. However, similarly to the Comparative Example, also in Reference Example 1, calculations are carried out by separate microstructure calculation modules provided independently for the respective steps, and therefore model adjustment that influences all steps cannot be achieved. Therefore, Reference Example 1 is also incapable of achieving calculation accuracy as high as that of the Example.

FIG. 16 shows calculation results obtained in Reference Example 1. As shown in FIG. 16, also according to Reference Example 1, the mean Em of error evaluation values of each lot is much larger than that of the foregoing Example. In addition, the overall error mean Emm was also large (0.29), which was much larger than 0.2 (see the hatched cell in FIG. 16). That is, it was confirmed that the calculation in accordance with Reference Example 1 cannot achieve prediction accuracy that can substitute for conventional trial and error.

Furthermore, according also to the information processor 1P, similarly to the information processor 1X, it is necessary to design a microstructure calculation module for each step; therefore, the man-hour required for program design is greater than that of the foregoing Example. That is, similarity to the information processor 1X, the information processor 1P is also much inferior to the information processor 1 in terms of customizability.

Reference Example 2

Figure 17:
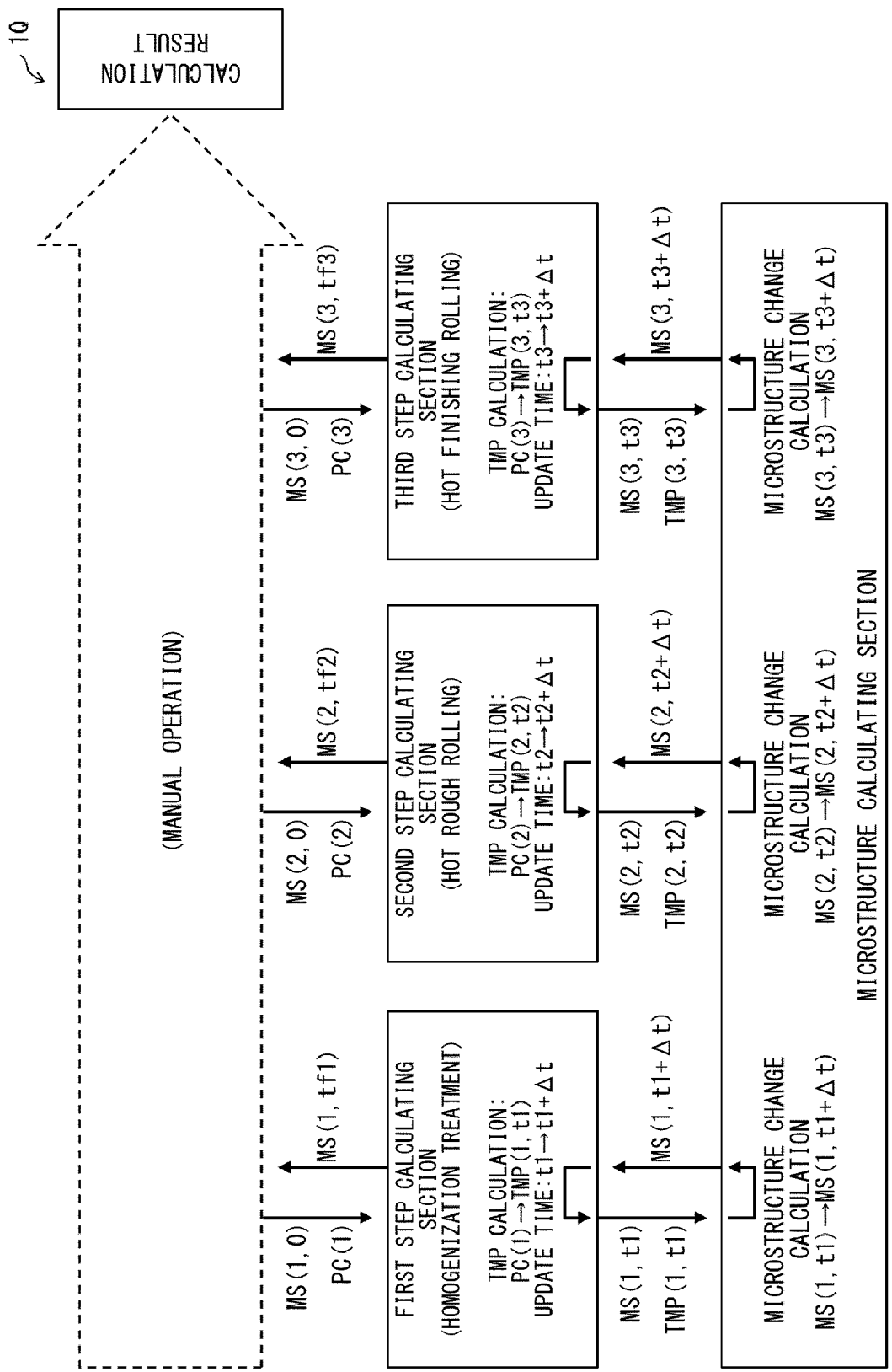
FIG. 17 illustrates an example of an overall process flow of Reference Example 2.

In Reference Example 2, the same PCs, TMPs, and MSs as those described in the foregoing Example were used, and the same calculations as described in the foregoing Example were carried out. FIG. 17 illustrates an example of an overall process flow of Reference Example 2. As illustrated in FIG. 17, an information processor 1Q in accordance with Reference Example 2 is different from the information processor 1 in that the information processor 1Q does not include the inter-step information integration section 11. Note that the items of an MS in Reference Example 2 are the same as those of the Example (see FIG. 7).

The information processor 1Q does not include the inter-step information integration section 11. Therefore, similarly to the information processor 1X of the Comparative Example, the information processor 1Q does not have the function of sharing information between steps. Therefore, data transfer, when calculation proceeds from an i-th step to the (i+1)-th step, needs to be manually carried out by a user (see also FIGS. 10 and 11). Thus, similarly to the information processor 1X, also according to the information processor 1Q, the man-hour required for MS calculation is greater than that of the information processor 1.

Furthermore, although the information processor 1Q includes a microstructure calculating section 13 that is common to all the step calculating sections, the information processor 1Q does not include the inter-step information integration section 11; therefore, the information processor 1Q is not capable of carrying out model adjustment that influences all steps. Therefore, Reference Example 2 is also incapable of achieving calculation accuracy as high as that of the Example.

FIG. 18 shows calculation results obtained in the information processor 1Q. As shown in FIG. 18, also according to Reference Example 2, the mean Em of error evaluation values of each lot is much larger than that of the foregoing Example. In addition, the overall error mean Emm was also large (0.40), which was much larger than 0.2 (see the hatched cell in FIG. 18). That is, it was confirmed that the calculation in accordance with Reference Example 2 cannot achieve prediction accuracy that can substitute for conventional trial and error.

Note, however, that the information processor 1Q includes the microstructure calculating section 13, which is common to all the step calculating sections. Therefore, the information processor 1Q is excellent in customizability similarly to the information processor 1.

Variation

Embodiment 1 discussed an example case in which information indicative of a TMP and information indicative of an MS (thermo-mechanical processing condition information and microstructure information) are represented as a TMP(i, t) and an MS(i, t), respectively. That is, Embodiment 1 discussed an example case in which TMP and MS of Al are assumed to be constant irrespective of the location (macroscopic location) on the Al.

Note, however, that TMPs(i, t) for a respective plurality of partial areas (areas) obtained by spatially dividing Al can be dealt with as different pieces of information, and MSs(i, t) for the respective plurality of partial areas can be dealt with as different pieces of information. That is, an arrangement in which the TMP and MS of Al are assumed to differ from one location (hereinafter "x") on Al to another can be employed.

Specifically, thermo-mechanical processing condition information can be represented as a TMP(i, x, t), and microstructure information can be represented as an MS(i, x, t). That is, information indicative of x (location information) can be added to represent TMP and MS. According to this arrangement, TMP and MS which differ from one partial area of Al to another can be taken into account. This makes it possible to predict an MS of Al more accurately.

For example, in a case of an Al sheet material, an area extending from the surface of the sheet to the center of the sheet is divided into a plurality of areas, and a change in MS in each area can be found. Specifically, with use of a known PC(i), an MS(i, x, t) can be found in the order of "PC(i)→TMP(i, x, t)→MS(i, x, t)". That is, TMP and MS may be found, similarly to Embodiment 1, for each of the plurality of areas.

For example, by finding a TMP for each of the plurality of areas, it is possible to find TMPs(i, x, t) from a PC(i). In this case, as described earlier, the theory of rolling or an FEM may be used to find a TMP for each of the plurality of areas.

Embodiment 2

Embodiment 1 discussed a technique to predict a microstructure of Al in an industrial process. Note, however, that a calculation technique used in an information processor in accordance with an aspect of the present invention can be applied not only to Al.

For example, the calculation technique can be used to predict a microstructure of a certain metallic product in an industrial process. For example, the calculation technique can be used to predict a microstructure of iron (Fe) or copper (Cu) in an industrial process.

Software Implementation Example

Control blocks of the information processor 1 (particularly, the control section 10) can be realized by a logic circuit (hardware) provided in an integrated circuit (IC chip) or the like or can be alternatively realized by software as executed by a central processing unit (CPU).

In the latter case, the information processor 1 includes a CPU that executes instructions of a program that is software realizing the foregoing functions; a read only memory (ROM) or a storage device (each referred to as "storage medium") in which the program and various kinds of data are stored so as to be readable by a computer (or a CPU); and a random access memory (RAM) in which the program is loaded. An object of the present invention can be achieved by a computer (or a CPU) reading and executing the program stored in the storage medium. Examples of the storage medium encompass "a non-transitory tangible medium" such as a tape, a disk, a card, a semiconductor memory, and a programmable logic circuit. The program can be made available to the computer via any transmission medium (such as a communication network or a broadcast wave) which allows the program to be transmitted. Note that an aspect of the present invention can also be achieved in the form of a computer data signal in which the program is embodied via electronic transmission and which is embedded in a carrier wave.

Aspects of the present invention can also be expressed as follows:

A microstructure calculating apparatus in accordance with Aspect 1 of the present invention is a microstructure calculating apparatus, wherein, with regard to an industrial process for manufacturing aluminum, the industrial process including first to N-th steps, i is a natural number satisfying $1 \le i \le N$, t represents a time in an i-th step, t=0 represents a time at which the i-th step starts, and t=tfi represents a time at which the i-th step ends, PC(i) represents a piece of information indicative of a processing condition for the aluminum in an i-th step, TMP(i, t) represents a piece of information indicative of a thermo-mechanical processing condition for the aluminum at a time t in an i-th step, and MS(i, t) represents a piece of information indicative of a microstructure of the aluminum at a time t in an i-th step, the microstructure calculating apparatus including: an inter-step information integration section configured to acquire PC(1) to PC(N) and MS(1, 0) as pieces of preset information; a step calculating section including first to N-th step calculating sections; and a microstructure calculating section configured to find a change over time in MS(i, t) based on an MS(i, t) and a TMP(i, t), the microstructure calculating section including a plurality of calculation modules configured to find changes over time in a respective plurality of metallurgical phenomena, an i-th step calculating section of the step calculating section being configured to find a TMP(i, t) based on a PC(i), the plurality of calculation modules being configured to receive respective MSs(i, t) having a common data structure, wherein, in the order of from i=1 to i=N, the inter-step information integration section supplies a PC(i) and an MS(i, 0) to each i-th step calculating section, and in each i-th step, in the order of from t=0 to t=tfi, the i-th step calculating section (i) supplies an MS(i, t) and a TMP(i, t) to the microstructure calculating section and thereby causes the microstructure calculating section to find an MS(i, tfi) and (ii) supplies the MS(i, tfi) to the inter-step information integration section, and the inter-step information integration section sets, as an MS(i+1, 0), the MS(i, tfi) received from the i-th step calculating section.

As described earlier, according to conventional techniques, it is difficult to deal with a change in MS (microstructure) of Al (aluminum) in an industrial process that includes a plurality of process steps. In contrast, according to the above arrangement, it is possible to find MSs(i, t) with regard to various PCs(i) (processing conditions). That is, it is possible to predict a change in MS that would occur as each step progresses.

This makes it possible to predict an MS obtained at the completion of manufacture of Al (i.e., MS(N, tfN)) more accurately than conventional techniques. That is, it is possible to predict an MS of Al in an industrial process more accurately than conventional techniques. Thus, according to an aspect of the present invention, it is possible to significantly reduce the number of times trial-and-error is carried out and significantly reduce cost in regard to an industrial process.

Furthermore, according to a microstructure calculating apparatus in accordance with an aspect of the present invention, it is possible to cause the microstructure calculating section to carry out calculations with use of MSs(i, t) having a common data structure for the respective first to N-th step calculating sections (respective first to N-th steps). That is, it is possible to carry out calculations with use of a single (common) microstructure calculating section. This eliminates the need for preparation of separate microstructure calculating sections for respective steps.

As such, a calculation system in accordance with an aspect of the present invention can be customized to suit for a step to be studied. This is also advantageous in that it is possible to significantly reduce the man-hour required for the development of a calculation system.

In Aspect 2 of the present invention, a microstructure calculating apparatus may be arranged such that, in Aspect 1, the i-th step calculating section is configured to find a TMP(i, t) based on a PC(i), the TMP(i, t) being a piece of information indicative of a temperature applied to the aluminum at a time t in an i-th step, an amount of strain applied to the aluminum at the time t in the i-th step, and a rate of strain applied to the aluminum at the time t in the i-th step.

As described earlier, temperature, the amount of strain, and the rate of strain are each an important parameter that is important for highly accurate predication of a change in MS of Al. Therefore, according to the above arrangement, it is possible to predict an MS of Al in an industrial process more accurately.

In Aspect 3 of the present invention, a microstructure calculating apparatus is arranged such that, in Aspect 1 or 2, the microstructure calculating section is configured to find, based on an MS(i, t) and a TMP(i, t), changes over time in a plurality of interactive metallurgical phenomena to thereby obtain an MS(i, t+Δt), where Δt is an infinitesimal time period.

According to the above arrangement, a change over time in MS associated with a plurality of interactive metallurgical phenomena can be taken into account. This makes it possible to predict an MS of Al in an industrial process more accurately.

In Aspect 4 of the present invention, a microstructure calculating apparatus is arranged such that, in any one of Aspects 1 to 3, an MS(i, t) contains pieces of information indicative of an amount of an alloying element(s) at a time t in an i-th step, an amount of a solute alloying element(s) at the time t in the i-th step, a particle size distribution of second phase particles at the time t in the i-th step, recrystallization ratio at the time t in the i-th step, and strain energy at the time t in the i-th step.

According to the above arrangement, a variety of parameters can be taken into account as MS information. This makes it possible to predict an MS of Al in an industrial process more accurately.

In Aspect 5 of the present invention, a microstructure calculating apparatus may be arranged such that, in any one of Aspects 1 to 4: the microstructure calculating section has a calculation model pre-set therein, the calculation model being configured to find a change over time in microstructure; and the inter-step information integration section is configured to adjust a parameter(s) contained in the calculation model so as to reduce an error between (a) pre-acquired data obtained by measuring the microstructure and (b) calculated data.

According to the above arrangement, a parameter(s) contained in a calculation model can be adjusted based on measured data. This makes it possible to predict an MS of Al in an industrial process more accurately.

In Aspect 6 of the present invention, a microstructure calculating apparatus is preferably arranged such that, in any one of Aspects 1 to 5, an MS(i, t) of the aluminum in a recrystallized state and an MS(i, t) of the aluminum in a non-crystallized state are dealt with as different pieces of information.

As described earlier, whether Al is recrystallized or not can greatly influence how each of a plurality of metallurgical phenomena changes over time. Therefore, according to the above arrangement, it is possible to predict an MS of Al in an industrial process more accurately.

In Aspect 7 of the present invention, a microstructure calculating apparatus is preferably arranged such that, in any one of Aspects 1 to 6, the plurality of calculation modules of the microstructure calculating section at least include a recovery module configured to find a change over time in recovery of the aluminum.

As described earlier, Al is a material that is prone to recovery. Therefore, according to the above arrangement, recovery of Al (which is a metallurgical phenomenon that is likely to occur in Al) can be taken into account by the recovery module, and thereby an MS of Al in an industrial process can be predicted more accurately.

In Aspect 8 of the present invention, a microstructure calculating apparatus is preferably arranged such that, in any one of Aspects 1 to 7: TMPs(i, t) for a respective plurality of partial areas obtained by spatially dividing the aluminum are dealt with as different pieces of information; and MSs(i, t) for the respective plurality of partial areas are dealt with as different pieces of information.

According to the above arrangement, TMP and MS, each of which differs from one partial area to another, can be taken into account. This makes it possible to predict an MS of Al more accurately.

A microstructure calculating apparatus in accordance with each aspect of the present invention can be realized by a computer. The computer is operated based on (i) a microstructure calculating apparatus control program for causing the computer to realize the microstructure calculating apparatus by causing the computer to operate as each section (software element) included in the microstructure calculating apparatus and (ii) a computer-readable storage medium in which the control program is stored. Such a control program and a computer-readable storage medium are included in the scope of the present invention.

Remarks

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

Another Way of Describing the Present Invention

An aspect of the present invention can also be described in the following manner.

A microstructure calculating apparatus in accordance with an aspect of the present invention is a microstructure calculating apparatus including, in regard to process steps for manufacture of an aluminum product: (i) a microstructure calculating section configured to calculate, with regard to an initial structure, a change over time in microstructure information based on a thermo-mechanical processing condition given to a material; (ii) a step calculating section configured to calculate a change over time in microstructure information that would occur in a target step, from microstructure information of the previous step, a manufacturing method in the target step, and a processing condition in the target step by calling the microstructure calculating section, and calculate microstructure information after the end of the target step; and (iii) an inter-step information integration section configured to transfer, to the next step, the microstructure information calculated by the step calculating section, the microstructure calculating apparatus being configured to (a) transfer a change in microstructure that would occur in an upstream step to a downstream step, (b) calculate microstructure information about aluminum for each step, and (c) calculate a microstructure for each step and a microstructure of an end product.

A microstructure calculating apparatus in accordance with an aspect of the present invention further includes, in regard to process steps for manufacture of an aluminum product: (i) a step calculating section configured to calculate a thermo-mechanical processing condition from a processing condition for a target step, the thermo-mechanical processing condition being a temperature applied to a material, amount of strain applied to the material, and rate of strain applied to the material, and calculate a change in microstructure that would occur in the target step from the thus-calculated temperature, the thus-calculated amount of strain, the thus-calculated rate of strain, and microstructure information for the previous step; and (ii) a microstructure calculating section configured to calculate, from the microstructure information for the previous step and the thermo-mechanical processing condition for the target step by use of a combination of a plurality of physical or empirical formulas, a change in microstructure that would result from concurrent proceedings of a plurality of metallurgical phenomena in the target step, wherein a microstructure is represented by microstructure information which is a microstructure parameter group including the amount of a main alloying element(s), the amount of a main solute alloying element(s), a size distribution function of main second phase particles, recrystallization ratio, and strain energy.

In a microstructure calculating apparatus in accordance with an aspect of the present invention, an inter-step information integration section has the function of improving prediction accuracy by adjusting a factor(s) contained in a step calculating section and/or a microstructure calculating section by using, as training data, microstructure factors for each step some of which have been actually measured.

REFERENCE SIGNS LIST

1 information processor (microstructure calculating apparatus)
11 inter-step information integration section
12 step calculating section
12a first step calculating section
12N N-th step calculating section
13 microstructure calculating section
130a recrystallization module (calculation module)
130b solid solution/precipitation module (calculation module)
130c deformed microstructure module (calculation module)
130d recovery module (calculation module)
PC(i) processing condition information (information indicative of processing condition for Al in i-th step)
TMP(i, t) thermo-mechanical processing condition information (information indicative of thermo-mechanical processing condition for Al at time t in i-th step)
MS(i, t) microstructure information (information indicative of microstructure of Al at time t in i-th step)
i step number
N number of steps
t time
$\Delta t$ infinitesimal time period
ti time in i-th step
tfi time at which i-th step ends

The invention claimed is:

1. A microstructure calculating apparatus to predict microstructure of aluminum, wherein, with regard to an industrial process for manufacturing aluminum, the industrial process including first to N-th steps,
   i is a natural number satisfying $1 \leq i \leq N$,
   t represents a time in an i-th step, t=0 represents a time at which the i-th step starts, and t=tfi represents a time at which the i-th step ends,
   PC(i) represents a piece of information indicative of a processing condition for the aluminum in an i-th step,
   TMP(i, t) represents a piece of information indicative of a thermo-mechanical processing condition for the aluminum at a time t in an i-th step, and
   MS(i, t) represents a piece of information indicative of a microstructure of the aluminum at a time t in an i-th step,
   the microstructure calculating apparatus comprising:
   an inter-step information integration section configured to acquire PC(1) to PC(N) and MS(1, 0) as pieces of preset information;
   a step calculating section including first to N-th step calculating sections; and
   a microstructure calculating section configured to find a change over time in MS(i, t) based on an MS(i, t) and a TMP(i, t),
   the microstructure calculating section including a plurality of calculation modules configured to find changes over time in a respective plurality of metallurgical phenomena,
   an i-th step calculating section of the step calculating section being configured to find a TMP(i, t) based on a PC(i),
   the plurality of calculation modules being configured to receive respective MSs(i, t) having a common data structure,
   wherein, in the order of from i=1 to i=N,
      the inter-step information integration section supplies a PC(i) and an MS(i, 0) to each i-th step calculating section, and
      in each i-th step, in the order of from t=0 to t=tfi,
         the i-th step calculating section (i) supplies an MS(i, t) and a TMP(i, t) to the microstructure calculating section and thereby causes the microstructure calculating section to find an MS(i, tfi) and (ii) supplies the MS(i, tfi) to the inter-step information integration section, and the inter-step information integration section sets, as an MS(i+1, 0), the MS(i, tfi) received from the i-th step calculating section;
wherein the microstructure calculating apparatus determines a policy for MS control including the PC(i) for a machine for performing the industrial process for manufacturing aluminum having a desired microstructure.

2. The microstructure calculating apparatus as set forth in claim 1, wherein the i-th step calculating section is configured to find a TMP(i, t) based on a PC(i), the TMP(i, t) being a piece of information indicative of a temperature applied to the aluminum at a time tin an i-th step, an amount of strain applied to the aluminum at the time tin the i-th step, and a rate of strain applied to the aluminum at the time tin the i-th step.

3. The microstructure calculating apparatus as set forth in claim 1, wherein the microstructure calculating section is configured to find, based on an MS(i, t) and a TMP(i, t), changes over time in a plurality of interactive metallurgical phenomena to thereby obtain an MS(i, t+Δt), where Δt is an infinitesimal time period.

4. The microstructure calculating apparatus as set forth in claim 1, wherein an MS(i, t) contains pieces of information indicative of an amount of one or more alloying elements at a time tin an i-th step, an amount of one or more solute alloying elements at the time tin the i-th step, a particle size distribution of second phase particles at the time tin the i-th step, recrystallization ratio at the time tin the i-th step, and strain energy at the time tin the i-th step.

5. The microstructure calculating apparatus as set forth in claim 1, wherein:
the microstructure calculating section has a calculation model pre-set therein, the calculation model being configured to find a change over time in microstructure; and
the inter-step information integration section is configured to adjust one or more parameters contained in the calculation model so as to reduce an error between (a) pre-acquired data obtained by measuring the microstructure and (b) calculated data.

6. The microstructure calculating apparatus as set forth in claim 1, wherein an MS(i, t) of the aluminum in a recrystallized state and an MS(i, t) of the aluminum in a non-crystallized state are dealt with as different pieces of information.

7. The microstructure calculating apparatus as set forth in claim 1, wherein the plurality of calculation modules of the microstructure calculating section at least include a recovery module configured to find a change over time in recovery of the aluminum.

8. The microstructure calculating apparatus as set forth in claim 1, wherein:
TMPs(i, t) for a respective plurality of partial areas obtained by spatially dividing the aluminum are dealt with as different pieces of information; and
MSs(i, t) for the respective plurality of partial areas are dealt with as different pieces of information.

* * * * *